(12) United States Patent
Otake et al.

(10) Patent No.: US 6,995,898 B2
(45) Date of Patent: Feb. 7, 2006

(54) MASK, SUBSTRATE WITH LIGHT REFLECTING FILM, METHOD FOR FORMING LIGHT REFLECTING FILM, METHOD FOR MANUFACTURING ELECTRO-OPTICAL DEVICE, ELECTRO-OPTICAL DEVICE, AND ELECTRONIC APPARATUS

(75) Inventors: Toshihiro Otake, Okaya (JP); Mutsumi Matsuo, Misato-mura (JP); Tadashi Tsuyuki, Okaya (JP)

(73) Assignee: Seiko Epson Corporation, (JP)

( * ) Notice: Subject to any disclaimer, the term of this patent is extended or adjusted under 35 U.S.C. 154(b) by 9 days.

(21) Appl. No.: 10/410,580

(22) Filed: Apr. 9, 2003

(65) Prior Publication Data

US 2003/0223121 A1    Dec. 4, 2003

(30) Foreign Application Priority Data

Apr. 10, 2002   (JP) .............................. 2002-108527

(51) Int. Cl.
*G02F 1/29* (2006.01)
*G02F 1/133* (2006.01)

(52) U.S. Cl. ...................... 359/318; 359/253; 349/113
(58) Field of Classification Search ................ 359/318, 359/315, 253, 247; 349/113, 106, 112
See application file for complete search history.

(56) References Cited

U.S. PATENT DOCUMENTS 5,940,154 A * 8/1999 Ukita et al. .................. 349/113

2002/0041350 A1 * 4/2002 Yamazaki et al. .......... 349/113

FOREIGN PATENT DOCUMENTS

| JP | 08-152621 | 6/1996 |
|----|-----------|--------|
| JP | 11-281972 | 10/1999 |
| JP | 2002-006774 | 1/2002 |
| JP | 2002-072184 | 3/2002 |

OTHER PUBLICATIONS

Communication from Japanese Patent Office re: counterpart application.

* cited by examiner

*Primary Examiner*—Georgia Epps
*Assistant Examiner*—Tuyen Tra
(74) *Attorney, Agent, or Firm*—Harness, Dickey & Pierce, P.L.C.

(57) ABSTRACT

A substrate is provided with a light reflecting film in which the depths of a plurality of concave portions formed on the surface of the base or the heights of a plurality of convex portions formed on the surface of the base are substantially equal, the planar shapes of the plurality of concave portions or the convex portions are overlapped circles and overlapped polygons, or any one of the aforesaid circles and polygons, and a plurality of concave portions or convex portions are randomly arranged over a plane, the substrate with the light reflecting film being prepared by using a mask comprising light-transmitting parts or non-light-transmitting parts formed by a plurality of dots less than the number of the dot regions as one unit, in which the light-transmitting parts or the non-light-transmitting parts are randomly arranged in the unit, and a plurality of the one unit is repeated.

23 Claims, 19 Drawing Sheets

FIG. 6
(a)
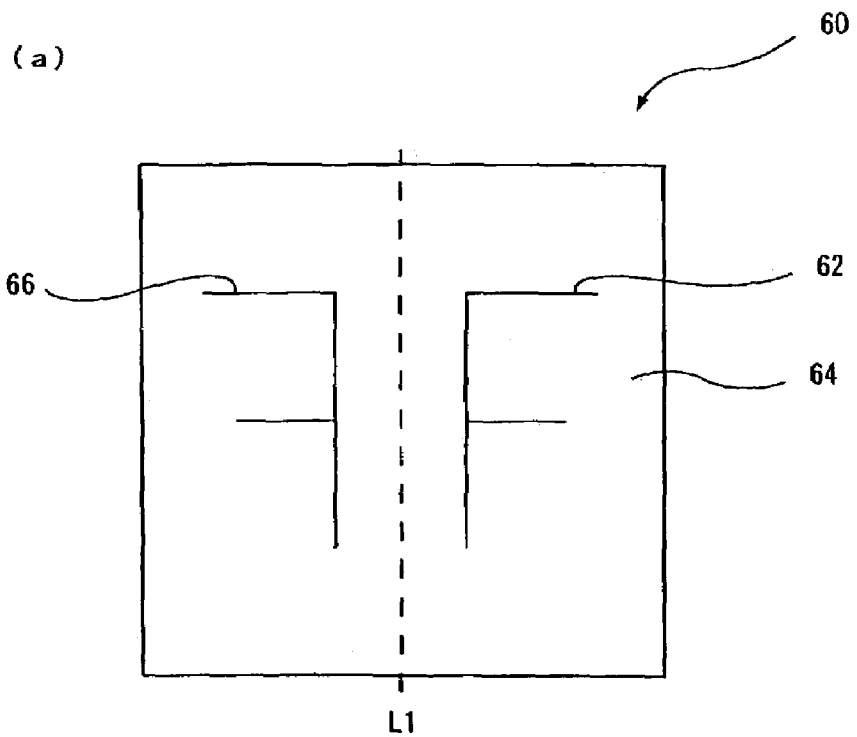
(b)
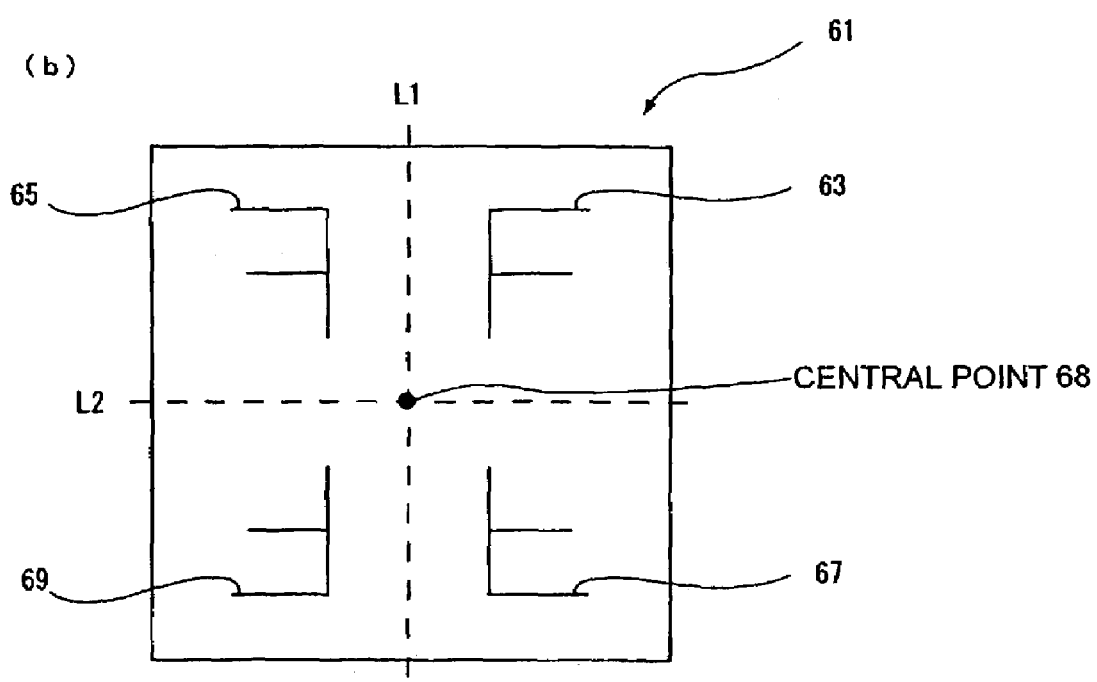

FIG. 8
(a)
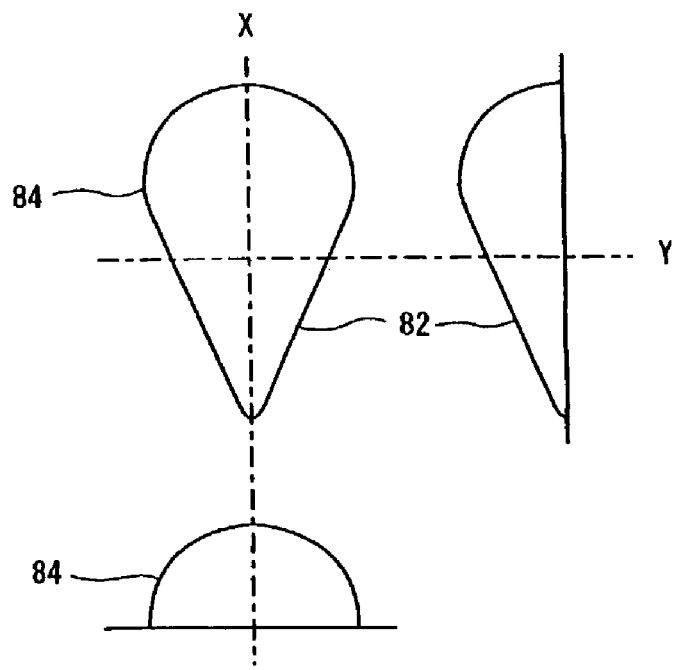
(b)
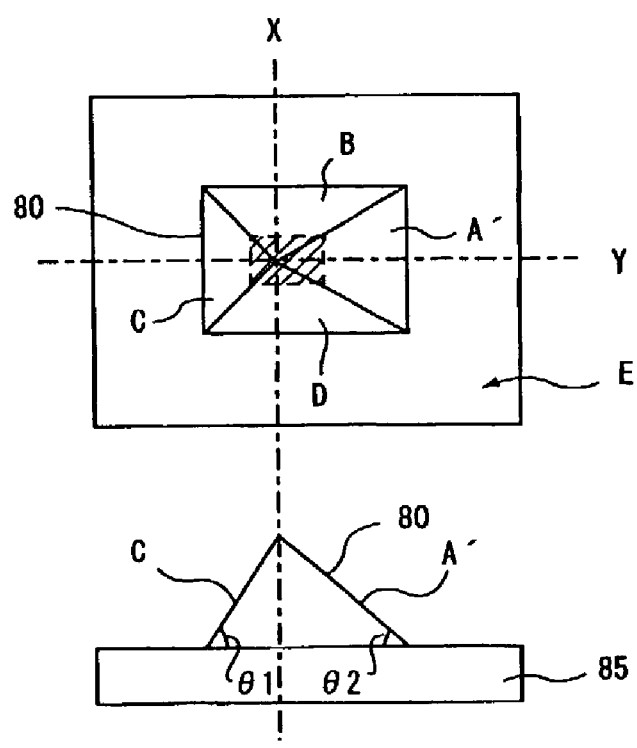

FIG. 12

FORMATION PROCESS OF A LIGHT REFLECTING FILM

FORMATION OF A FIRST LAYER
- P31 APPLYING A FIRST LAYER — 800 RPM × 10 SEC
- P32 PRE-BAKING — HOT PLATE/100° C, 2 MIN.
- P33 EXPOSING i-RAY — 365 nm/Gp = 60 μm  EXPOSING TOTALLY FOR 4SEC WITH 80 mJ
- P34 DEVELOPING — POSITIVE DEVELOPMENT
- P35 POST-EXPOSING — i-RAY OVERALL RADIATION/300 mJ
- P36 POST-BAKING — 220° C, 50 MIN.

FORMATION OF A SECOND LAYER
- P37 APPLYING A SECOND LAYER — 1000 RPM × 10 SEC.
- P38 PRE-BAKING — HOT PLATE/100° C, 2 MIN.
- P39 EXPOSING i-RAY — 365 nm/Gp = 120 μm  EXPOSING TOTALLY FOR 5 SEC WITH 100 mJ
- P40 EXPOSING i-RAY — POSITIVE DEVELOPMENT
- P41 POST-EXPOSING — i-RAY OVERALL RADIATION/300 mJ
- P42 POST-BAKING — 220° C, 50 MIN.

FORMATION OF A REFLECTING FILM
- P43 APPLYING REFLECTING FILM MATERIAL — 0.2 μm
- P44 PHOTO-ETCHING THE REFLECTING FILM — FOR TRANSMISSIED LIGHT REMOVING THE PERIPHERY

FIG. 28
PRIOR ART
(a)
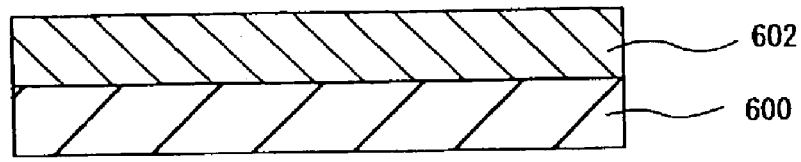
(b)
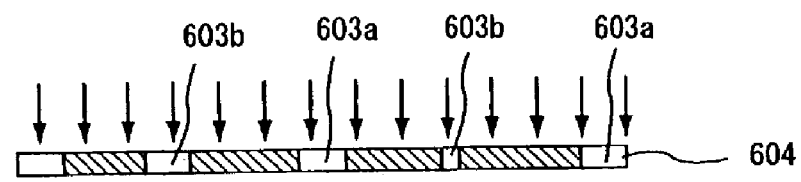
(c)
(d)
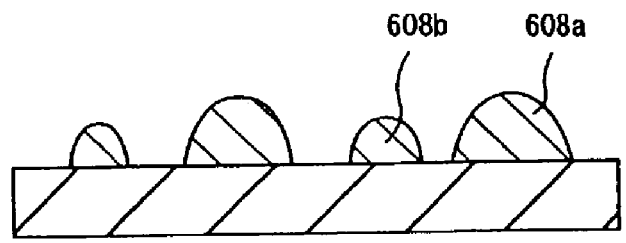
(e)
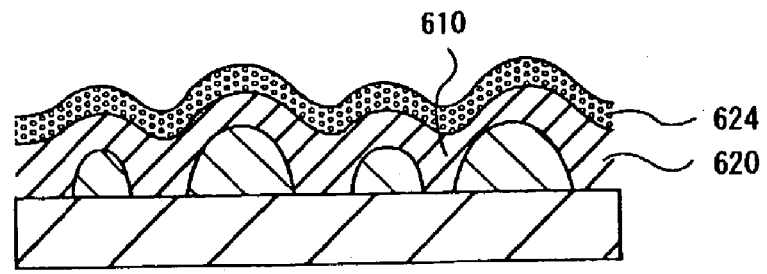

MASK, SUBSTRATE WITH LIGHT REFLECTING FILM, METHOD FOR FORMING LIGHT REFLECTING FILM, METHOD FOR MANUFACTURING ELECTRO-OPTICAL DEVICE, ELECTRO-OPTICAL DEVICE, AND ELECTRONIC APPARATUS

BACKGROUND OF THE INVENTION

1. Technical Field of the Invention

The present invention generally relates to a mask, a substrate with a light reflecting film, a method for forming a light reflecting film, a method for manufacturing an electro-optical device, an electro-optical device, and an electronic apparatus.

More particularly, the present invention relates to a mask for manufacturing a substrate with a light reflecting film which reduces the occurrence of interference fringes, a substrate with a light reflecting film formed using the mask, a method for forming a light reflecting film, an electro-optical device comprising a substrate with a light reflecting film which reduces the occurrence of interference fringes, and an electronic apparatus comprising a substrate with a light reflecting film which reduces the occurrence of interference fringes.

2. Related Art

As well known to those skilled in the art, a liquid crystal display device is widely used as a display unit for various electronic apparatuses in line with increasing demand for the electronic apparatuses having thin constitutions and low power consumptions. Such a liquid crystal display device generally has a constitution that in a state of enclosing liquid crystal between a pair of glass substrates, the circumferences of the substrates are bound by means of a sealant. In an electronic apparatus having such a liquid crystal display device mounted therein, a protective plate is disposed on the viewing side of the liquid crystal display device, i.e., on the side of the display facing a viewer, in order to protect the liquid crystal display device against any external impacts. The protective plate normally comprises a plate-shaped member made of a material having a light transmittance characteristic, for example, such as transparent plastic.

However, it is difficult to make the surface of the protective plate opposite to the liquid crystal display device completely smooth over its whole surface, with a result that fine concave portions or convex portions are often present on its surface. Consequently, the display quality may be remarkably deteriorated due to the fine concave portions or convex portions on the surface of the protective plate in case that the protective plate is used in the liquid crystal display device.

One of the reasons for the deterioration of the display quality is that the gap between the substrate on the viewing side of the liquid crystal display device and the protective plate has non-uniformity depending on the concave portions or the convex portions on the surface of the protective plate. In other words, interference is generated due to the non-uniformity of the gap between the substrate and the protective plate when the light emitted from the liquid crystal display device is transmitted through the protective plate, with a result that generates interference fringes. Therefore the interference fringes that occur are overlapped with the displayed images, so that display quality may be deteriorated.

A reflection type liquid crystal display device 400 as shown in FIG. 26 is disclosed in Japanese Unexamined Patent Application Publication No. 6-27481, and a hybrid reflecting/transmitting type liquid crystal display device 500 as shown in FIG. 27 is disclosed in Japanese Unexamined Patent Application Publication No. 11-281972. In the aforesaid liquid crystal display devices, a plurality of concave portions or convex portions 404a, 404b (504a, 504b), the height of which are different from each other, are provided in order to decrease the generation of the interference fringes, respectively. Polymer resin films 405 (505) are formed on the concave and convex portions, and continuous wavelike reflecting electrodes 409 (509) are formed on the polymer resin films.

A method for manufacturing a liquid crystal display device having the aforesaid reflecting electrodes is also disclosed, an example of which is shown in FIG. 28. As shown in FIG. 28(a), a resist film 602 is formed over the entire surface of the glass substrate 600. As shown in FIG. 28(b), the resist film 602 is exposed via a pattern 604 comprising a plurality of circles whose diameters are different from one another. Next, the exposed resist film 602 is developed as shown in FIG. 28(c), to form a plurality of angled convex portions 606a and 606b whose heights are different from each other. And then, as shown in FIG. 28(d), the angled convex portions 606a and 606b are heated to soften the angled parts of the convex portions 606a and 606b, with the result that rounded concave portions 608a and 608b are formed. Subsequently, a predetermined amount of polymer resin 620 is filled up in pitches 610 between the concave and convex portions to form a continuous layer having a wavelike surface, as shown in FIG. 28(e). Finally, a continuous wavelike reflecting electrode 624 is formed on the polymer resin film 620 using a laminating method, for example, a sputtering method.

In the reflection type liquid crystal display device or the hybrid reflecting/transmitting type liquid crystal display device disclosed in Japanese Unexamined Patent Application Publication No. 6-27481 etc., however, a plurality of concave and convex portions whose heights are different from one another are provided using a mask having a plurality of circles whose diameters are different from one another and which are regularly arranged or partially irregularly arranged, by means of ultraviolet exposure and development, so that it is difficult to adjust the heights precisely since the coating thickness is not uniform, whereby the light interference is not effectively prevented. Furthermore, electric lines may be easily broken or short-circuited because the reflecting electrode is formed on a plurality of concave and convex portions whose heights are different from one another. Also, a method for manufacturing the disclosed substrate with the light reflecting film has drawbacks in that it comprises too many steps, and thus involves control of many items.

Consequently, it is difficult to effectively prevent the generation of the interference fringes in the substrates with the light reflecting film disclosed in Japanese Unexamined Patent Application Publication No. 6-27481, and it is difficult to manufacture the aforesaid substrate with the light reflecting film stably and efficiently.

Therefore, the inventors of the present invention examine thoroughly the aforesaid problems, and come to the conclusion that a substrate with a light reflecting film which reduces the occurrence of interference fringes can be easily obtained by the steps of forming a plurality of concave portions or convex portions on a base of the substrate with the light reflecting film, and randomly arranging the concave portions or the convex portions over a plane while the depths of the concave portions or the heights of the convex portions are substantially unchanged.

Therefore, it is an object of the present invention to provide a mask for easily manufacturing a substrate with a light reflecting film which reduces the occurrence of interference fringes, such substrate with a light reflecting film, a method for forming such light reflecting film, an electro-optical device comprising such substrate with a light reflecting film, and an electronic apparatus comprising such substrate with a light reflecting film.

SUMMARY

In accordance with the present invention, the above problems can be solved by the provision of a mask for forming a pattern on a substrate having a plurality of dot regions, the mask comprising:

light-transmitting parts capable of transmitting incident light therethrough; and non-light-transmitting parts for substantially not transmitting the light therethrough, wherein the light-transmitting parts or the non-light-transmitting parts are formed in predetermined shapes, the predetermined shapes partially overlapping each other.

Therefore, by arranging patterns formed by the light-transmitting parts or the non-light-transmitting parts having any of the predetermined shapes, for example, the light-transmitting parts or the non-light-transmitting parts having a planar shape of a circle (including oval, hereinafter the same) and a polygon, or any one of the aforementioned circle and the polygon, which are partially overlapped, over a plane, an excellent light scattering effect can be obtained and the generation of the interference fringes can be effectively prevented when manufacturing the substrate with the light reflecting film.

Furthermore, in case that a plurality of dots are used as a basic unit in the liquid crystal display device using the substrate with the light reflecting film, for example in case that the light-transmitting parts or the non-light-transmitting parts are randomly arranged for example, in 3-dot units, 6 dot units, or 12 dot units of the RGB dots corresponding to the pixels, over a plane, the amount of information concerning the patterns formed by the light-transmitting parts or the non-light-transmitting parts may be reduced. Consequently, when forming the patterns formed by the light-transmitting parts or the non-light-transmitting parts having the predetermined shape, for example, the pattern formed by the light-transmitting parts or the non-light-transmitting parts having a planar shape of a circle (including oval) and a polygon, or any one of the aforementioned circle and the polygon, which are partially overlapped, the mask can be designed extremely easily and in a short time by repeating the basic unit.

The reason for controlling the planar shape of the light-transmitting parts or the non-light-transmitting parts is that, as a photosensitive resin constituting the base of the light reflecting film, a positive resin having portions on which the light transmitted through the light-transmitting parts is irradiated may be used, the portions being photolyzed and solubilized in a developing agent, and a negative resin having portions on which the light transmitted through the light-transmitting parts is irradiated may be used, the portions being exposed to the light and insolubilized in the developing agent.

Preferably, the diameter of the light-transmitting part or the non-light-transmitting part is any value within the range of 3 to 15 µm in constructing a mask according to the present invention.

Preferably, the mask further comprises a plurality of the light-transmitting parts each having a different diameters or a plurality of the non-light-transmitting parts each having a different diameters in constructing a mask according to the present invention.

Namely, for example, it is preferable to provide from 2 to 10 kinds of the light-transmitting parts or the non-light-transmitting parts of the mask, the diameters of which are different from each other or from one another.

In accordance with another aspect of the present invention, the present invention provides a mask for forming a pattern on a substrate having a plurality of dot regions, the mask comprising:

light-transmitting parts capable of transmitting incident light therethrough; and non-light-transmitting parts for not substantially transmitting the light therethrough, wherein the light-transmitting parts or the non-light-transmitting parts are formed in predetermined shapes, the predetermined shapes partially overlapping each other, and wherein patterns formed by the light-transmitting parts or by the non-light-transmitting parts are formed in one unit of a plurality of dots, the patterns including symmetric portions in the unit.

By constructing as mentioned above, it is possible to efficiently manufacture the substrate with the light reflecting film which reduces the occurrence of interference fringes. That is, the light can be properly scattered using predetermined symmetrical patterns, for example, the patterns mirror symmetry with respect to the imaginary line obtained by dividing the mask by one imaginary line when manufacturing the substrate with the light reflecting film, so that the generation of the interference fringes is effectively prevented. Furthermore, since the symmetrical patterns are used repeatedly, the amount of information concerning the patterns can be reduced, and thus the substrate with the light reflecting film can be easily manufactured.

Furthermore, in accordance with another aspect of the present invention, the present invention provides a substrate with a light reflecting film including a base and a reflecting layer, the substrate has the light reflecting film having concave portions or convex portions; and the concave portions or the convex portions are formed in predetermined shapes, the predetermined shapes partially overlapping each other.

Since the aforesaid concave portions or convex portions have the predetermined shapes and are randomly arranged over a plane, for example, in 3 dot units, 6 dot units, or 12 dot units of the RGB dots corresponding to the pixels, excellent light scattering effect can be obtained and the generation of the interference fringes can be effectively prevented.

Preferably, the depths of the concave portions or the heights of the convex portions are substantially equal over a plane when preparing the substrate with the light reflecting film according to the present invention.

For example, the depths of a plurality of concave portions formed on the surface of the base or the heights of a plurality of convex portions formed on the surface of the base may be substantially equal in the substrate with the light reflecting film comprising the base and the light reflecting film.

Since the depths of a plurality of concave portions or the heights of a plurality of convex portions are substantially equal, the substrate with the light reflecting film can be easily manufactured, and a uniform reflecting characteristic can be obtained.

Furthermore, if the depths of a plurality of concave portions or the heights of a plurality of convex portions are substantially equal, and thus the surface of the light reflecting film is relatively smooth, deterioration of the display quality due to the convex and concave constitutions of the gap between the light scattering film and the protective plate is efficiently prevented even in case the light scattering film is combined with the protective plate of the liquid crystal display device.

Preferably, the diameters of a plurality of concave portions or the convex portions are any values within the range of 3 to 15 $\mu$m when preparing the substrate with the light reflecting film according to the present invention.

For example, it is preferable to form a plurality of concave portions or the convex portions with the planar shapes of circles and polygons, which are partially overlapped, respectively, or any one of the aforementioned circles and the polygons, and the diameters of concave portions or the convex portions are any values within the range of 3 to 15 $\mu$m.

Moreover, it is preferable that the pitches between a plurality of concave portions or the convex portions are any values within the range of 2 to 30 $\mu$m when preparing the substrate with the light reflecting film according to the present invention.

Furthermore, it is preferable that the depths of a plurality of concave portions or the heights of the convex portions are any values within the range of 0.1 to 10 $\mu$m when preparing the substrate with the light reflecting film according to the present invention.

Besides, it is preferable that the units which are defined by a plurality of the dots is less than the number of the dots of the whole substrate, and a plurality of one unit is contained to constitute the whole substrate when preparing the substrate with the light reflecting film according to the present invention.

Further, it is preferable that the substrate with the light reflecting film further comprises a plurality of concave portions whose diameters are different from one another, or a plurality of convex portions whose diameters are different from one another when preparing the substrate with the light reflecting film according to the present invention.

Further, in accordance with another aspect of the present invention, the present invention provides a substrate with a light reflecting film formed thereon, the substrate having a plurality of dot regions, wherein:

the substrate has the light reflecting film having concave portions or convex portions; the concave portions or the convex portions are formed in predetermined shapes, the predetermined shapes partially overlapping each other; and patterns formed by the concave portions or the convex portions are formed by a plurality of dots as one unit, the patterns including symmetric portions in the unit.

Moreover, in accordance with another aspect of the present invention, the present invention provides an electro-optical device having a plurality of dot regions, comprising: a substrate having a light reflecting film formed thereon, the light reflecting film having concave portions or convex portions; and an electro-optical layer supported by the substrate, wherein the concave portions or the convex portions are formed in predetermined shapes, the predetermined shapes partially overlapping each other.

Further, it is preferable that the depths of the concave portions or the heights of the convex portions are substantially equal over a plane when preparing the electro-optical device according to the present invention.

Preferably, one unit (the basic unit) defined by a plurality of the dots is less than the number of the dot regions of the whole substrate, and a plurality of the one unit is repeated to constitute the whole substrate when preparing the electro-optical device according to the present invention.

Preferably, one pixel is formed by a plurality of colored layers whose colors are different from one another, which are disposed corresponding to a plurality of the dots, and a plurality of the dots corresponding to the colored layers, whereby at least one pixel corresponds in one unit when preparing the electro-optical device according to the present invention.

In accordance with yet another aspect of the present invention, the present invention provides an electro-optical device having a plurality of dot regions, comprising: a substrate having a light reflecting film formed thereon, the light reflecting film having concave portions or a depressed portion; and an electro-optical layer supported by the substrate, wherein the concave portions or the convex portions are formed in predetermined shapes, the predetermined shapes partially overlapping each other, and wherein patterns formed by the concave portions or by the convex portions are formed in one unit of a plurality of dots, the patterns including symmetric portions in the unit.

Further, it is preferable that one pixel is formed by a plurality of colored layers whose colors are different from one another, which are disposed corresponding to a plurality of the dots, and a plurality of the dots corresponding to the colored layers, at least one pixel correspond in one unit when preparing the electro-optical device according to the present invention.

Furthermore, in accordance with another aspect of the present invention, the present invention provides an electro-optical device comprising: an electro-optical layer; a light scattering film disposed on one side of the electro-optical layer; and a light reflecting film disposed on the other side of the electro-optical layer, wherein the concave portions or the convex portions being irregularly arranged are formed on the light reflecting film, and wherein the concave portions or the convex portions are formed in predetermined shapes, the predetermined shapes partially overlapping each other.

Further, it is preferable that the haze value of the combined light scattering film is any value within the range of 10 to 60% when preparing the electro-optical device according to the present invention.

Further, it is preferable that the electro-optical device has a plurality of dot regions, patterns formed by the concave portions or the convex portions are non-uniformly arranged in one unit defined by one or two dots, and the haze value of the jointly used light scattering film is any value within the range of 40 to 60% when preparing the electro-optical device according to the present invention.

Moreover, it is preferable that one pixel is formed by a plurality of the dots and a plurality of colored layers having different colors, which are disposed corresponding to a plurality of the dots, whereby at least one pixel corresponds in one unit when preparing the electro-optical device according to the present invention.

Preferably, the electro-optical device has a plurality of dot regions, patterns formed by the concave portions or the convex portions are irregularly arranged in one unit including three or more dots, and the haze value of the combined light scattering film is any value within the range of 10 to 40% when preparing the electro-optical device according to the present invention.

Preferably, the electro-optical device further comprises a protective plate disposed on the one side of the electro-optical layer when preparing the electro-optical device according to the present invention.

In accordance with another aspect of the present invention, the present invention further provides an electronic apparatus comprising, as a display unit, an electro-optical device having a plurality of dot regions, comprising: a substrate having a light reflecting film formed thereon, the light reflecting film having concave portions or convex portions; and an electro-optical layer supported by the substrate, wherein the light reflecting film has concave portions or convex portions formed thereon, the concave portions or the convex portions being irregularly arranged and formed in predetermined shapes, the predetermined shapes partially overlapping each other.

In accordance with another aspect, the present invention further provides an electronic apparatus comprising, as a display unit, an electro-optical device, comprising: a substrate having a light reflecting film formed thereon, the light reflecting film having concave portions or a depressed portion; and an electro-optical layer supported by the substrate, wherein the light reflecting film has concave portions or convex portions formed thereon, the concave portions or the convex portions being irregularly arranged and formed in predetermined shapes, the predetermined shapes partially overlapping each other, and wherein patterns formed by the concave portions or by the convex portions are formed in one unit of a plurality of dots, the patterns including symmetrical portions in one unit.

In accordance with another aspect of the present invention, the present invention further provides an electronic apparatus comprising, as a display unit, an electro-optical device comprising: an electro-optical layer; a light scattering film disposed on one side of the electro-optical layer; and a light reflecting film disposed on the other side of the electro-optical layer, wherein the concave portions or the convex portions being irregularly arranged are formed on the light reflecting film.

In accordance with another aspect of the present invention, the present invention further provides a method for forming a light reflecting film on a base having a plurality of dot regions, comprising the steps of: applying a photosensitive material on the base; exposing the photosensitive material; forming concave and convex portions on the exposed photosensitive material; and forming a light reflecting film on the concave and convex potions, wherein the concave and convex portions are formed in predetermined shapes, the predetermined shapes partially overlapping each other.

In accordance with yet another aspect of the present invention, the present invention provides a method for forming a light reflecting film on a base having a plurality of dot regions, comprising the steps of: applying a photosensitive material on the base; exposing the photosensitive material; forming concave and convex portions on the exposed photosensitive material; and forming a light reflecting film on the concave and convex portions, wherein the concave and convex portions are formed in predetermined shapes, the predetermined shapes partially overlapping each other, and wherein patterns of the concave portions or the convex portions are formed by a plurality of dots as one unit, and the patterns include symmetrical portions in the unit.

A method of manufacturing an electric-optical device of the present invention, comprises the steps of: applying a photosensitive material on the base; exposing the photosensitive material; forming concave and convex portions on the exposed photosensitive material; and forming a light reflecting film on the concave and convex portions, wherein the concave and convex portions are formed in predetermined shapes, the predetermined shapes partially overlapping each other, and the method further comprises the step of forming a light reflecting film on the base having a plurality dots regions.

Further, another method for manufacturing an electro-optical device of the present invention, comprises the steps of: applying a photosensitive material on the base; exposing the photosensitive material; forming concave portions or convex portions on the exposed photosensitive material; and forming a light reflecting film on the concave and convex portions, wherein the concave and convex portions are formed in predetermined shapes, the predetermined shapes partially overlapping each other, and wherein the steps of forming patterns of the concave portions or the convex portions by a plurality of the dots as one unit to include symmetric portions in one units of a plurality of the dots and forming a light reflecting film on the base having a plurality of dots regions.

BRIEF DESCRIPTION OF THE DRAWINGS

FIGS. 6a and 6b are a plan views of a mask in which light transmitting or non-transmitting portions are mirror symmetry.

FIGS. 8a and 8b show plan and cross-sectional views of a substrate with a light reflecting film including a substantially non-symmetrical teardrop-shaped convex portion.

FIG. 12 is a flow chart of the process for manufacturing the substrate with the light reflecting film.

FIGS. 28a–28e illustrates a process for manufacturing a conventional liquid crystal display device.

DETAILED DESCRIPTION

Hereinafter, embodiments of the present invention will be described with reference to the accompanying drawings. It should be noted that the preferred embodiments of the present invention are disclosed only for illustrative purposes, and do not limit the present invention. Accordingly, various modifications of the invention may be possible without departing from the scope and spirit of the invention.

First Embodiment

In a first embodiment of the present invention, a mask is provided for forming a pattern on a substrate having a plurality of dot regions, the mask comprising: light-transmitting parts capable of transmitting incident light therethrough; and non-light-transmitting parts for substantially not transmitting the light therethrough, wherein the light-transmitting parts or the non-light-transmitting parts are formed in predetermined shapes, the predetermined shapes partially overlapping each other.

Figure 2:
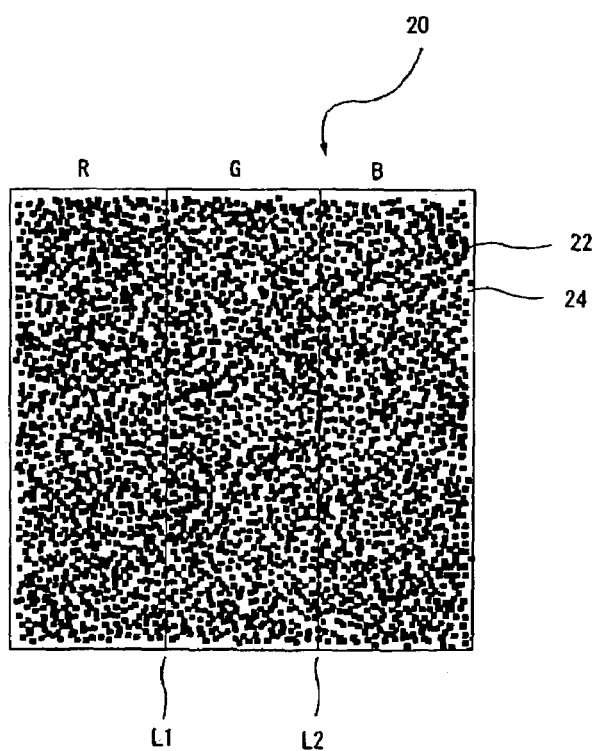
FIG. 2 is a plan view of a mask in which light transmitting or non-transmitting portions are randomly arranged on the planar direction in one pixel (RGB: 3 dot) unit.

Namely, for example, a mask 20 for manufacturing a substrate with a light reflecting film, as shown in FIG. 2, comprises light-transmitting parts or non-light-transmitting parts 22. The light-transmitting parts or non-light-transmitting parts 22 have planar shapes of circles (including ovals) and polygons, or any one of the aforementioned circles and polygons, which are partially overlapped, respectively. The light-transmitting parts or the light-transmitting parts 22 are arranged randomly in a plane by dot units less than the number of dot regions, for example, by RGB dots, as one unit corresponding to the predetermined pixels which are arranged irregularly.

1. Light-Transmitting Parts or the Non-Light-Transmitting Parts (1) Shape

Figure 1:
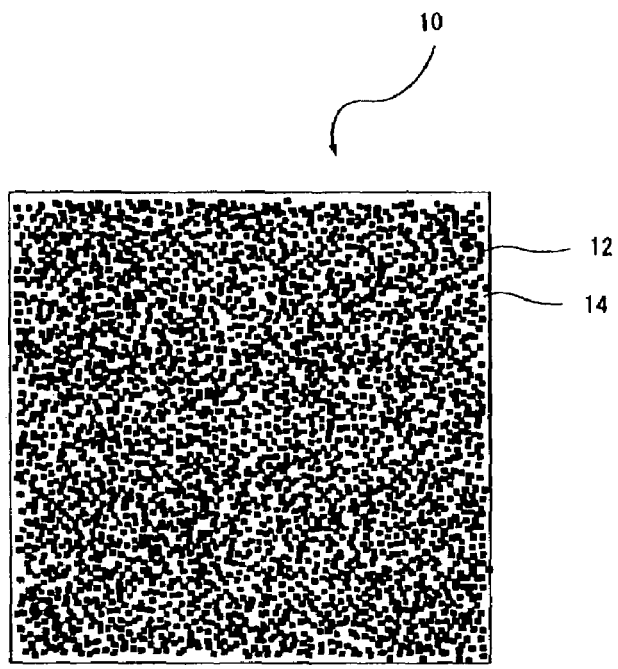
FIG. 1 is a plan view of a mask in accordance with the present invention.

As shown in FIG. 1, the light-transmitting parts or the non-light-transmitting parts of the mask preferably have planar shapes of circles (including ovals) and polygons, or any one of the aforementioned circles and polygons, which are partially overlapped, respectively.

This is because the concave and convex portions of a resin can be arranged complicatedly in an exposure process for manufacturing the substrate with the light reflecting film by forming the circles (including ovals) and the polygons, which are partially overlapped, respectively, as the planar shapes of the light-transmitting parts or the non-light-transmitting parts. Furthermore, the circles (including ovals) and the polygons, which are partially overlapped, respectively, are basic figures, with the result that the mask itself can be manufactured easily and conveniently. Moreover, as the preferable polygons, squares, pentagons, hexagons, or octagons, which are partially overlapped, may be used respectively.

In addition, it is not necessary to configure the planar shapes of the light-transmitting parts or the non-light-transmitting parts as the circles (including the ovals) or the polygons, which are overlapped as a whole. It is also preferable to include the circles (including the ovals) or the polygons, which are partially separated, for controlling the amount of reflection.

In this case, it is preferable that the number of the light-transmitting parts or the non-light-transmitting parts consisting of the separated circles or polygons, is 20 to 90% assuming that the number of the light-transmitting part or the non-light-transmitting parts is 100%.

This is because, if the number of the light-transmitting parts or the non-light-transmitting parts consisting of the separated circles or polygons is less than 20%, the overlapping is increased, and thus the patterns are connected to each other. On the other hand, the separated patterns are dominant and interference fringes are further increased if the number of the light-transmitting parts or the non-light-transmitting parts consisting of the separated circles or polygons is more than 90% of all of the light-transmitting parts or the non-light-transmitting parts. Consequently, the number of the light-transmitting parts or the non-light-transmitting parts consisting of the separated circles or polygons preferably is any value within the range of 25 to 70% of the number of all of the light-transmitting parts or the non-light-transmitting parts, and more preferably 40 to 60% of the number of all of the light-transmitting parts or the non-light-transmitting parts.

(2) Diameter and Pitch

Moreover, the diameters of light-transmitting parts or the non-light-transmitting parts in the mask preferably are any values within the range of 3 to 15 $\mu$m.

This is because if the diameters of light-transmitting parts or the non-light-transmitting parts are below 3 $\mu$m, the accurate control of the planar shapes or their arrangement of the concave portions or the convex portions is difficult even by the exposure process to manufacture the substrate with the light reflecting film. Moreover, it is difficult to manufacture the mask itself if the diameters of light-transmitting parts or the non-light-transmitting parts are below 3 $\mu$m.

On the other hand, it is difficult to properly scatter the light on the resulting substrate with the light reflecting film, and the scattering property is reduced, which leads to dark reflection, if the diameters of light-transmitting parts or the non-light-transmitting parts are above 15 μm.

Consequently, the diameters of light-transmitting parts or the non-light-transmitting parts preferably are any values within the range of 5 to 13 μm, and more preferably 6 to 12 μm.

The diameter of at least one of the light-transmitting parts or the non-light-transmitting parts preferably is not less than 5 μm. That is, the diameter of at least one of the light-transmitting parts or the non-light-transmitting parts is not less than 5 μm and the diameters of the others of the light-transmitting parts or the non-light-transmitting parts may be below 5 μm, if the diameter of at least one of the light-transmitting parts or the non-light-transmitting parts is different from the diameters of the others of the light-transmitting parts or the non-light-transmitting parts.

This is because if the planar shapes of the light-transmitting parts or the non-light-transmitting parts are circles or polygons of below 5 μm in diameter, the light may be excessively scattered on the resulting substrate with the light reflecting film, which leads to dark reflection. On the other hand, the scattering effect of the light is deteriorated, and interference fringes may be generated if the diameters of light-transmitting parts or the non-light-transmitting parts are excessively large.

Consequently, the diameter of at least one of the light-transmitting parts or the non-light-transmitting parts of the mask preferably is any value within the range of 5 to 13 μm, and more preferably 6 to 12 μm.

The pitches of the light-transmitting parts or the non-light-transmitting parts of the mask preferably are any values within the range of 2 to 30 μm.

If the pitches of the light-transmitting parts or the non-light-transmitting parts are below 3.5 μm, the separation characteristic of the light-transmitting parts or the non-light-transmitting parts is deteriorated and the overlapping is increased.

Meanwhile the random arrangement characteristic of the light-transmitting parts or the non-light-transmitting parts may be deteriorated if the pitches of the light-transmitting parts or the non-light-transmitting parts exceed 30 μm.

Consequently, the pitches of the light-transmitting parts or the non-light-transmitting parts of the mask preferably are any values within the range of 3 to 20 μm, and more preferably 4 to 15 μm.

Further, each of the pitches of the light-transmitting parts or the non-light-transmitting parts is equal to the distance from the center of one of the light-transmitting parts or the non-light-transmitting parts to the center of the neighboring light transmitting or non-light-transmitting part, which is an average value taken from more than 10 portions.

Figure 5:
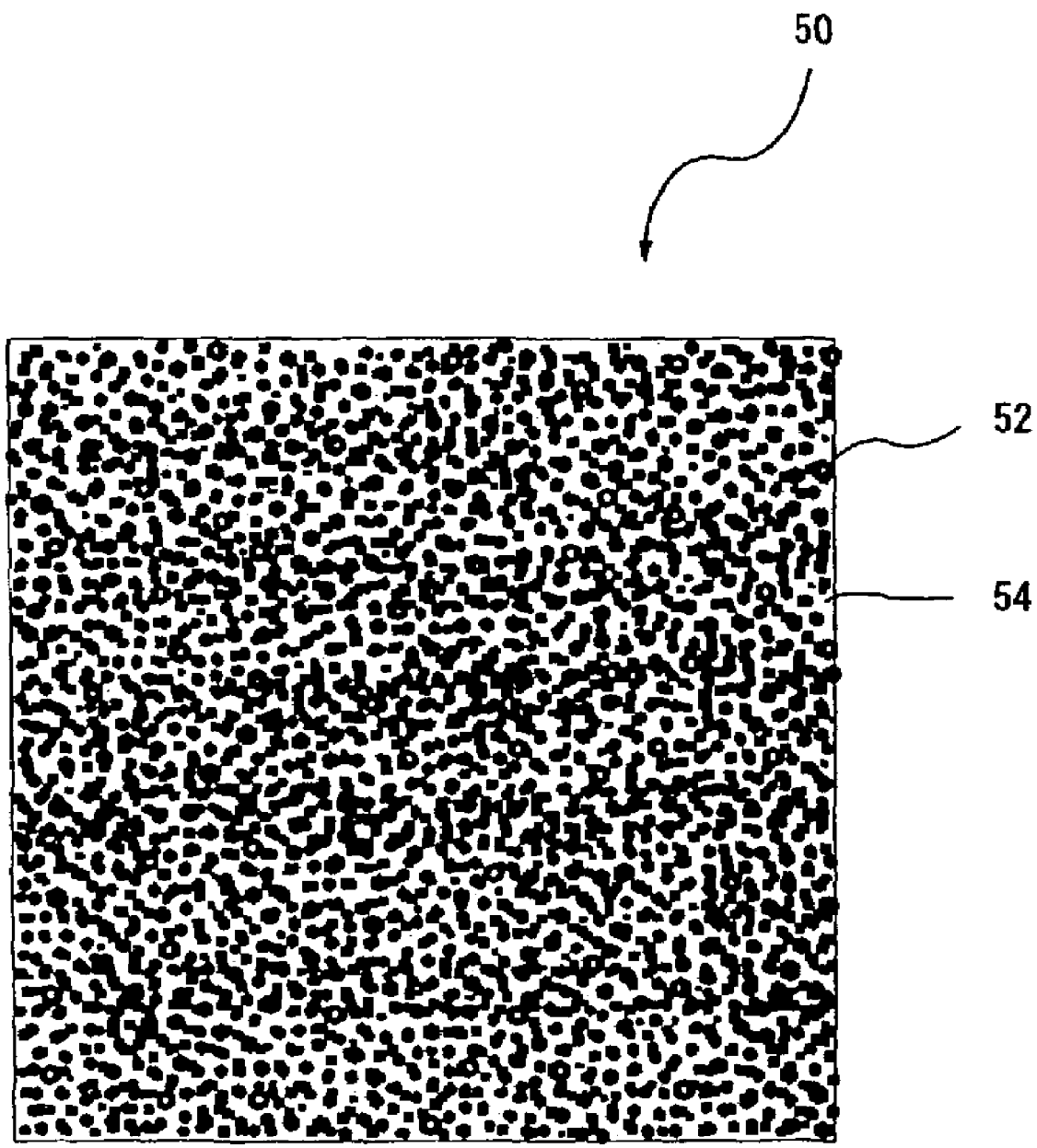
FIG. 5 is a plan view of a mask in which the diameters of light transmitting or non-transmitting portions are different from one another.

(3) Kind 2 to 10 kinds of the light-transmitting parts or the non-light-transmitting parts of the mask preferably have different diameters. As shown in FIG. 5, for example, the light-transmitting parts or the non-light-transmitting parts whose diameters are different from each other are provided in one of the random patterns.

This is because, the substrate with the light reflecting film with reduced generation of the interference fringes can be manufactured more efficiently by the light-transmitting parts or the non-light-transmitting parts whose diameters are different from each other. That is, the arrangement of the resulting concave portions or convex portions can be further scattered, and thus the light can be properly scattered in case that the substrate with the light reflecting film is manufactured using such mask. Consequently, the generation of the interference fringes can be effectively prevented when the substrate with the light reflecting film is used in a liquid crystal display device.

Besides, the patterns of the light-transmitting parts or the non-light-transmitting parts, whose diameters are different from each other, may be combined with each other in the mask pattern for the light reflecting film as follows: 1) combination of an overlapping hexagon pattern of 7.5 μm and an overlapping hexagon pattern of 9 μm; 2) combination of an overlapping hexagon pattern of 5 μm, an overlapping hexagon pattern of 7.5 μm and an overlapping hexagon pattern of 9 μm; and 3) combination of an overlapping square pattern of 4.5 μμm, an overlapping square pattern of 5 μm, an overlapping hexagon pattern of 7.5 μm, an overlapping hexagon pattern of 9 μm, and an overlapping hexagon pattern of 11 μm.

(4) Area Ratio

The area ratio of the light-transmitting parts or the non-light-transmitting parts of the mask is any value within the range of 10 to 60% of the whole area.

This is because if the area ratio is below 10%, the area occupied by a plurality of concave portions or the convex portions is reduced to increase evenness at the time of manufacturing the substrate with the light reflecting film, and the light scattering effect is remarkably reduced. On the other hand, the evenness is increased and the light scattering effect is remarkably reduced even if the area ratio is above 60%.

Consequently, the area ratio of the light-transmitting parts or the non-light-transmitting parts of the mask is preferably any value within the range of 15 to 50% of the whole area, and more preferably 20 to 40% of the whole area.

Moreover, in case that a positive resin is used as the photosensitive resin constituting the base, the portions on which the light transmitted through the light-transmitting parts is irradiated are photolyzed and solubilized in a developing agent. As a result, such area ratio of the non-light-transmitting parts of the mask is problematic. On the other hand, in case that the negative resin is used as the photosensitive resin constituting the base, the portions on which the light transmitted through the light-transmitting parts is irradiated are exposed to the light and insolubilized in the developing agent. As a result, the area ratio of the light-transmitting parts of the mask is problematic.

2. Random Arrangement (1) Random Arrangement 1

In the first preferred embodiment, for example, the light-transmitting parts or the non-light-transmitting parts 12 of the mask 10 are arranged randomly over a plane, as shown in FIG. 1.

That is, in case that the substrate with the light reflecting film is formed using the aforesaid mask by the exposure process, a plurality of concave portions or the convex portions are randomly and easily arranged on the base, and thus the light is properly scattered.

The random arrangement generally means that the light-transmitting parts or the non-light-transmitting parts are randomly arranged. Specifically, it means that the patterns are completely different from one another, respectively, or the patterns are not completely uniform even though the partially overlapped portions exist in case that the mask is separated into pieces by cutting it into units of a predetermined area, and the separated pieces of the mask are overlapped.

(2) Random Arrangement 2

The light-transmitting parts or the non-light-transmitting parts of the mask patterns for the light reflecting film preferably are randomly arranged over a plane by RGB dots for forming pixels on the liquid crystal display device in which the light reflecting film is used, as a reference.

That is, the light-transmitting parts or the non-light-transmitting parts of the mask patterns are preferably randomly arranged in planar direction in such manner that they are repeatedly arranged by repeating, as one unit, one pixel (RGB: 3 dots), two pixels (RGB: 6 dots), or four pixels (RGB: 12 dots) in the liquid crystal display device in which the light reflecting film is used as a unit.

Figure 3:
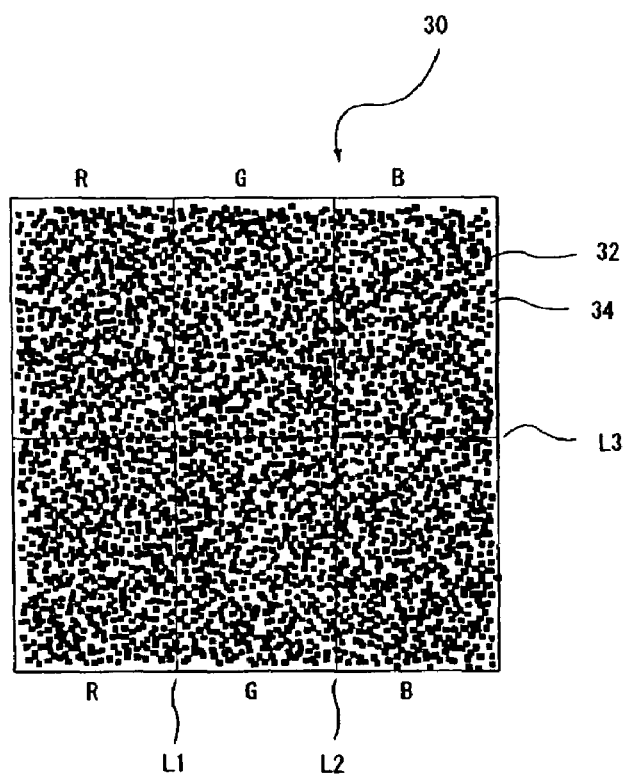
FIG. 3 is a plan view of a mask in which light transmitting or non-transmitting portions are randomly arranged on the planar direction in one unit including two pixels (RGB: 6 dot).
Figure 4:
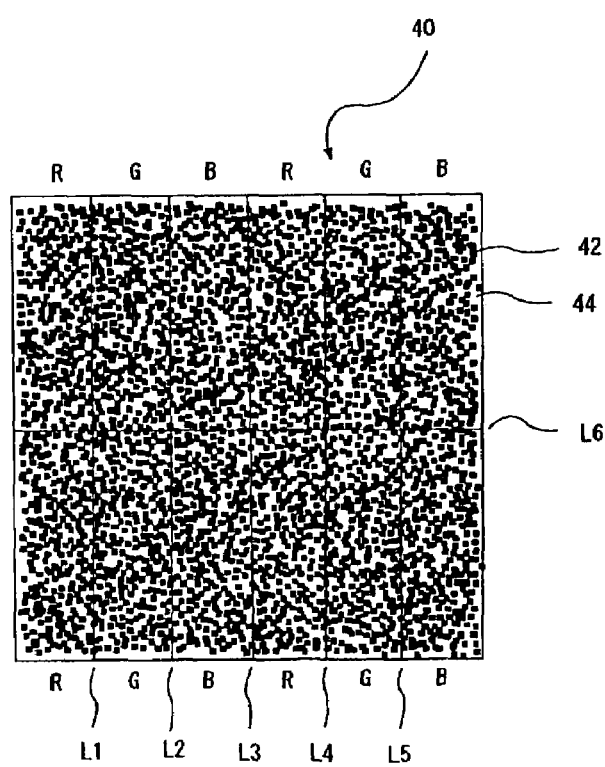
FIG. 4 is a plan view of a mask in which light transmitting or non-transmitting portions are randomly arranged on the plane in one unit area including four pixels (RGB: 12 dot).

As shown in FIG. 2, for example, it is possible to repeat the random patterns of the light-transmitting parts or the non-light-transmitting parts 22 by three kinds of RGB dots, which are divided by vertical lines L1 and L2, as one unit. As shown in FIG. 3, it is also possible to repeat the random patterns of the light-transmitting parts or the non-light-transmitting parts 32 by six kinds of RGB dots, which are divided by the vertical lines L1 and L2, and a horizontal line L3 as one unit. Furthermore, as shown in FIG. 4, it is possible to repeat the random patterns of the light-transmitting parts or the non-light-transmitting parts 42 by 12 kinds of RGB dots, which are divided by vertical lines L1 to L5, and a horizontal line L6, as one unit.

This is because by making the mask having patterns formed by such the RGB dots as a basic unit, the light is properly scattered by a plurality of concave portions or the convex portions on the resulting light reflecting film, and the generation of the interference fringes is effectively prevented. Furthermore, as the patterns formed by some of the RGB dots as a basic unit are provided, an amount of information of the patterns may be reduced, and thus the position of the patterns are easily adjusted at the time of manufacturing the light reflecting film.

Furthermore, according to the present invention, an element having pixels, for example, a color filter, is not necessarily required, and thus the random patterns may be formed in RGB dots in case that the light-transmitting parts or the non-light-transmitting parts of the mask patterns for light reflecting film are randomly arranged over a plane by the RGB dots on the liquid crystal display device as one unit.

(3) Random Arrangement 3

The mask is preferably divided by at least one imaginary line so that the patterns formed by the light-transmitting parts or the non-light-transmitting parts are arranged in mirror symmetry with respect to the imaginary line as the central line in constructing the mask.

By providing the aforesaid constitution, the substrate with the light reflecting film in which the generation of the interference fringes is reduced can be manufactured more efficiently. That is, at the time of manufacturing the substrate with the light reflecting film, a plurality of concave portions or the convex portions are the mirror symmetric patterns, and therefore, the light can be properly scattered. Consequently, the generation of the interference fringes can be prevented more effectively.

Furthermore, since the mirror symmetric patterns are used, the same patterns can be formed by means of rotation around the symmetry line. Consequently, the amount of information of the patterns can be reduced, whereby the substrate with the light reflecting film can be easily manufactured.

Now, the mirror symmetry patterns as the random arrangement will be described in detail with reference to FIGS. 6(a) and 6(b). In FIGS. 6(a) and 6(b), the patterns formed by the light-transmitting parts or the non-light-transmitting parts consisting of circles or polygons are indicated by character patterns(F) for the purpose of easily understanding of the relations between the mirror symmetry patterns.

Moreover, as shown in FIG. 6(a), the character patterns (F) consisting of a plurality of concave portions or the convex portions preferably is arranged with the mirror symmetry, i.e., with the bilateral symmetry with respect to the imaginary line L1. From the aforesaid constitution, one of the patterns can be reversed so that the other patterns can be duplicated.

As shown in FIG. 6(b), the character patterns(F) consisting of a plurality of concave portions or the convex portions preferably are arranged with the mirror symmetry, respectively, i.e., with the bilateral symmetry and with the up-and-down symmetry with respect to two imaginary lines L1 and L2. From the aforesaid constitution, it is possible to form the other 3 character patterns using one of the character patterns 63. That is, the character pattern 65 can be formed by reversing the character pattern 63 with respect to the imaginary line L1 as an axis. Further, the character pattern 67 can be also formed by reversing the character pattern 63 with respect to the imaginary line L2 as an axis. Similarly, the character pattern 69 can be formed by rotating character pattern 63 by 180° with respect to a central point 68.

If the patterns are formed with the mirror symmetry by any of the aforesaid formations, the overlapping of the patterns obtained by the symmetry of the imaginary line cannot be overlapped in vertical direction, and thus the light can be properly scattered by one of the random patterns provided by the present invention.

Second Embodiment

In a second embodiment of the present invention, the present invention provides a substrate with a light reflecting film formed thereon, the substrate having a plurality of dot regions, wherein the light reflecting film has concave portions or convex portions, the concave portions or the convex portions are formed in predetermined shapes, the predetermined shapes partially overlapping each other, and patterns formed by the concave portions or the convex portions are randomly arranged in one unit defined by a plurality of dots.

Figure 7:
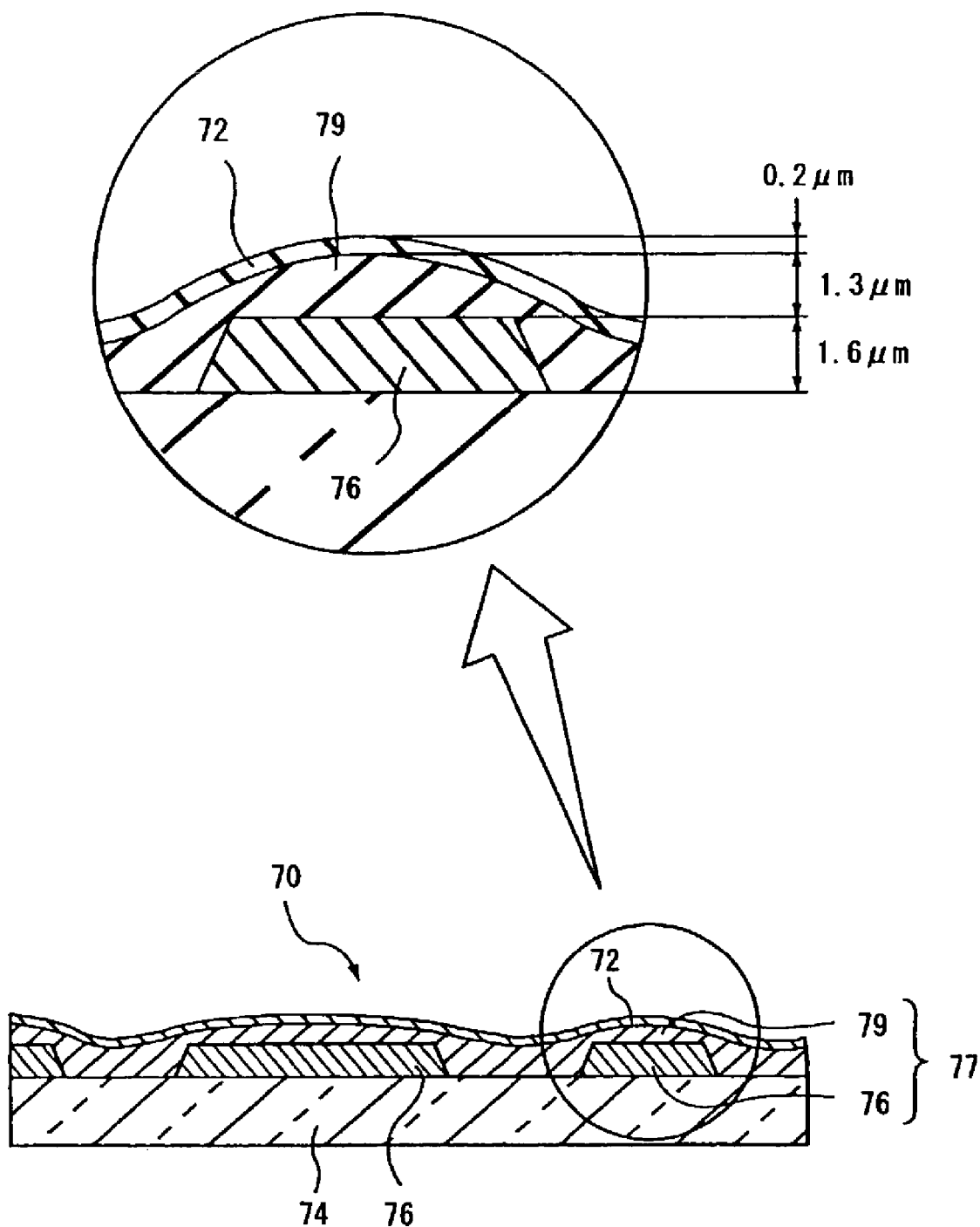
FIG. 7 is a cross-sectional view of a substrate with a light reflecting film including first substrate and second substrates.

FIG. 7 shows as one example that a negative type photosensitive resin is used. As shown in FIG. 7, the substrate 70 with the light reflecting film comprises a base 77 and a reflecting layer 72. The depths of a plurality of concave portions or the heights of a plurality of convex portions 76 formed on the base 77 are substantially equal. The planar shapes of the concave portions or the convex portions 76 are circles and polygons, or any one of the aforesaid circles and polygons which are partially overlapped. FIGS. 29 to 33 are plan views showing examples of overlapped convex (or concave) portions 76. Shapes of the individual convex (or concave) portions 76 are indicated in the drawings by broken line. Note that that broken line sections are not actually visible in the light reflecting film. A plurality of concave portions or the convex portions 76 are randomly arranged over a plane.

1. Base

As shown in FIG. 7, the base comprises successively a first base 76 and a second base 79 over the first base 76. The first base 76 comprises a plurality of separated convex portions, and the second base 79 is a continuous layer.

By providing the aforesaid constitution, a reflecting layer 72 formed on the second base 79 can be a relatively smooth curved face by virtue of the second base 79, which is the continuous layer. As a result, the generation of the interference fringes is effectively prevented in case that the base is used in the liquid crystal display device.

One preferred example of the base 77 comprising the first base 76 and the second base 79 in this order from bottom, as shown in FIG. 7, will now be described.

(1) First Base

The depths of a plurality of the separated concave portions or the heights of the convex portions of the first base are any values within the range of 0.5 to 5 μm.

This is because if the depths of the concave portions or the heights of the convex portions are below 0.5 μm, it is difficult to provide the reflecting layer having a proper curved surface via the second base. On the other hand, if the depths of the concave portions or the heights of the convex portions are above 5 μm, the convex and concave portion ratio of the reflecting layer is increased, and thus the light is excessively scattered, or electric lines may be easily broken.

Consequently, the depths of a plurality of the separated concave portions or the heights of the convex portions of the first base preferably are any values within the range of 0.8 to 4 μm, and more preferably 1 to 3 μm.

(2) Second Base

The depths of continuous concave portions and the heights of the continuous convex portions of the second base preferably are any values within the range of 0.1 to 3 μm.

This is because if the depths of the concave portions or the heights of the convex portions are below 0.1 μm, it is difficult to provide the reflecting layer having a proper curved surface on the second base. On the other hand, if the depths of the concave portions or the heights of the convex portions are above 3 μm, the convex and concave ratio of the reflecting layer formed on the second base is increased, and thus the light is excessively scattered, or electric lines may be easily broken.

Consequently, the depths of separated concave portions and the heights of the separated convex portions of the second base preferably are any values within the range of 0.1 to 2 μm, and more preferably 0.3 to 2 μm.

(3) A Plurality of Concave Portions or Convex Portions

1. Planar Shapes of Concave Portions or Convex Portions

A plurality of concave portions or convex portions on the base preferably have the planar shapes of circles and polygons, or any one of the aforementioned circles and the polygons, which are partially overlapped, respectively.

This is because by providing the planar shapes of the circles and the polygons, or any one of the aforementioned circles and polygons, which are partially overlapped, respectively, the planar shapes or the arrangement patterns of a plurality of concave portions or the convex portions can be correctly controlled using the exposure process. Furthermore, the light can be scattered, and the generation of the interference fringes is effectively prevented by providing the concave portions or the convex portions of the aforesaid planar shapes.

Furthermore, the preferred examples of planar shapes of convex portions may be ideally exemplified by an offset oval shape (a shape of a water drop) as shown in FIG. 8(a), or an offset rectangular shape (a shape of an oblique pyramid) as shown in FIG. 8(b). On the other hand, the planar shapes of concave portions may be also ideally exemplified by an oval dome shape, a tear drop shape, an oblique pyramid shape, a rectangular trough shape, or a pyramid shape as shown in FIGS. 18 to 22.

Figure 9:
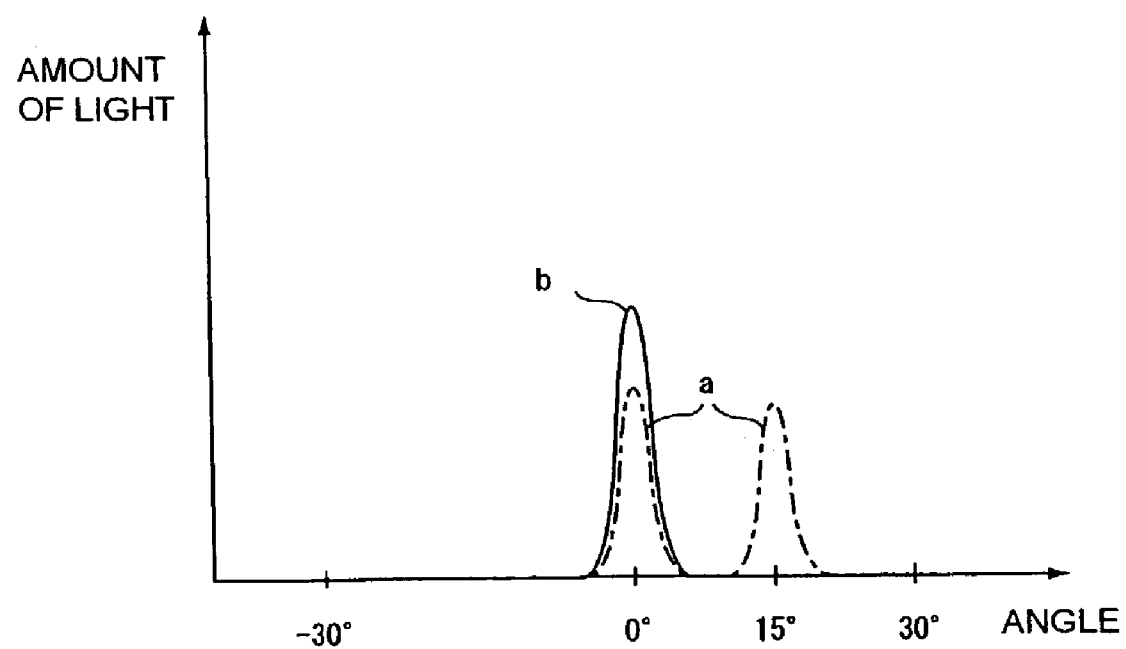
FIG. 9 is a graph illustrating the relationship between the amount of light to be displayed and the viewing angle of light.

This is because by providing the shapes of a plurality of concave portions or convex portions with the aforesaid planar shapes, the light directional characteristic is improved while the predetermined light scattering characteristic is maintained together with an incline plane in the height direction, as shown in FIG. 9. In FIG. 9, a one-dot chain line a indicates the amount of light sensed in the case of the offset oval shape as shown in FIG. 8(a), and a solid line b indicates the amount of light sensed in the case of the non-offset but even circular shape. Consequently, an amount of light observed at the time of viewing from a fixed direction, for example, at the portions where an angle is +15°, is increased by the aforesaid planar shapes, whereby a bright picture can be recognized at that position.

2. Diameters of Concave Portions or Convex Portions

The diameters of a plurality of concave portions or convex portions formed on the base preferably are any values within the range of 3 to 15 μm.

This is because by providing a plurality of concave portions or the convex portions formed on the base having the diameters of the aforesaid ranges, the planar shapes or the arrangement patterns can be accurately controlled using the exposure process, the light can be properly scattered, and the generation of the interference fringes can be effectively prevented. Furthermore, irregular stain shapes are less sensible by providing a plurality of concave portions or the convex portions formed on the base having the diameters of the aforesaid ranges.

Consequently, the diameters of a plurality of concave portions or convex portions preferably are any values within the range of 5 to 13 μm, and more preferably 6 to 12 μm.

3. Depths of the Concave Portions and Heights of the Convex Portions

Further, the depths of a plurality of concave portions on the base or the heights of a plurality of convex portions formed on the base are any values within the range of 0.1 to 10 μm.

This is because if the depths of the concave portions or the heights of the convex portions are below 0.1 μm, the light scattering characteristic is lowered even using the exposure process. On the other hand, the convex and concave ratio of the reflecting layer is increased, and thus the light is excessively scattered or electric lines may be easily broken, if the depths of the concave portions or the heights of the convex portions are above 10 μm.

Consequently, the depths of the concave portions or the heights of the convex portions are any values within the range of 0.2 to 3 μm, and more preferably 0.3 to 2 μm.

4. Random Arrangement 1

Further, preferably the depths of a plurality of concave portions formed on the surface of the base or the heights of a plurality of convex portions formed on the surface of the base, especially the depths of the concave portions or the heights of the convex portions constituting the first base are substantially equal, and a plurality of concave portions or convex portions are randomly arranged over a plane.

This is because if a plurality of concave portions or convex portions are regularly arranged, the plurality of fringes are generated, and thus the quality of the picture is remarkably deteriorated in case that they are used in the liquid crystal display device.

Further, if the depths of the concave portions or the heights of the convex portions are different as described in Japanese Unexamined Patent Application Publication No. 6-27481 or Japanese Unexamined Patent Application Publication No. 11-281972, it is difficult to manufacture the light reflecting film, and the generation of the interference fringes cannot be stably controlled. Therefore, the depths of a plurality of concave portions or the heights of a plurality of convex portions constituting the first base are substantially equal according to the present invention.

Further, it is preferable to provide a plurality of concave portions or the convex portions, the diameters of which are different from each other or from one another, for example, to form 2 to 10 kinds of the concave portions or the convex portions.

This is because by providing the aforesaid constitution, more complicated light reflection is possible, which cannot be accomplished by one kind of the concave portions or the convex portions, and the light can be scattered more effectively.

Consequently, it is possible to effectively prevent the generation of the interference fringes by providing a plurality of concave portions or the convex portions, the diameters of which are different from each other or from one another.

5. Random Arrangement 2

It is preferable to randomly arrange a plurality of concave portions or the convex portions over a plane by one pixel (RGB: 3 dots), two pixels (RGB: 6 dots), or four pixels (RGB: 12 dots) as one unit on the liquid crystal display device in which the light reflecting film is used.

This is because the light can be properly scattered even by a plurality of concave portions or the convex portions with some of RGB dots as a unit, with a result that the generation of the interference fringes can be effectively prevented. Furthermore, the amount of information of the patterns can be reduced by patterning in RGB dots as basic unit, and positioning of the patterns can be made easily at the time of manufacturing the light reflecting film.

As described above, the aforesaid random arrangement can be easily formed using the exposure process by the mask patterns for the light reflecting film as shown in FIGS. 2 to 4.

6. Random Arrangement 3

Further, it is preferable to divide the base by the imaginary line so that a plurality of concave portions or the convex portions are arranged with the mirror symmetry with respect to the imaginary line.

By providing the aforesaid constitution, the light can be properly scattered using the mirror symmetry. Consequently, the generation of the interference fringes can be prevented more effectively. Also, if the mirror symmetric patterns are used, the concave portions or the convex portions can be harmonized with one another by means of rotation about the line of symmetry. Consequently, the amount of information of the patterns is reduced, whereby the substrate with the light reflecting film can be manufactured with ease.

Furthermore, the mask having the mirror symmetric patterns described in the first preferred embodiment can be properly used in preparing the mirror symmetric patterns.

(4) Openings

Openings for allowing the partial passage of the light preferably are formed through the substrate with the light reflecting film. By providing the aforesaid constitution, the substrate with the light reflecting film can be used in a hybrid reflecting/transmitting type liquid crystal display device.

Figure 10:
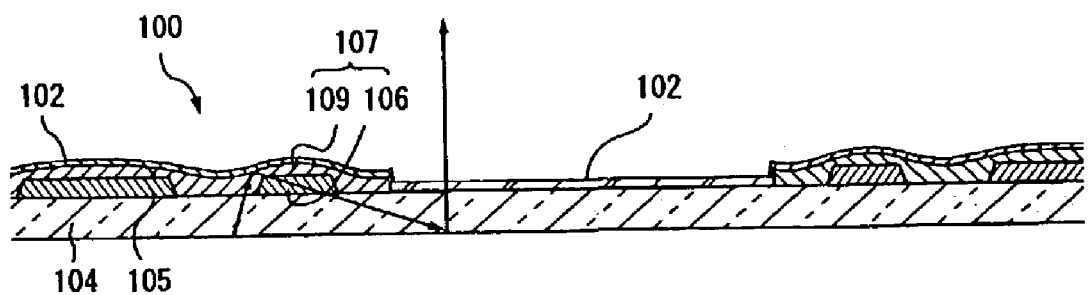
FIG. 10 is a cross-sectional view of a substrate with a light reflecting film having openings.

That is, as shown in FIG. 10, by providing a opening 102 in a part of the light reflecting film 100, the light from the outside is efficiently reflected by the light reflecting film 100. Even the light generated from the inside can be effectively emitted to the outside through the openings 102.

The sizes of the openings preferably are determined depending on the use of the substrate with the light reflecting film, although they are not particularly limited. For example, it is preferable that the sizes of the openings are any values within the range of 5 to 80% of the entire area of the substrate with the light reflecting film, more preferably 10 to 70%, and most preferably 20 to 60%.

2. Reflecting Layer

1. Thickness

The thickness of the reflecting layer on the substrate with the light reflecting film preferably is any value within the range of 0.05 to 5 μm.

This is because if the thickness of the reflecting layer is below 0.05 μm, the reflecting effect may be remarkably deteriorated. On the other hand, the flexibility of the resulting substrate with the light reflecting film is deteriorated and the time for manufacture is excessively increased if the thickness of the reflecting layer is above 5 μm.

Consequently, the thickness of the reflecting layer preferably is any value within the range of 0.07 to 1 μm, and more preferably 0.1 to 0.3 μm.

2. Kind

As a material for the reflecting layer may be used a metallic material with excellent conductivity and light reflecting ability, for example, such as aluminum (Al), silver (Ag), copper (Cu), gold (Au), chrome (Cr), tantalum (W), or nickel (Ni), although it is not particularly limited.

In addition, a transparent conductive material, such as indium tin oxide (ITO), indium oxide, or tin oxide, may also be used on the reflecting layer.

Furthermore, it is preferable to form an electric insulating film on the surface of the reflecting film consisting of the metallic material or sputter the electric insulating film as well as the metallic material in case of being fused into the liquid crystal when the metallic material or the transparent conductive material is use.

3. Bottom Layer

Further, in forming the reflecting layer on the second base, it is preferable to provide a bottom layer having the thickness of between 0.01 to 2 μm, so that the adherent force is increased and the curved surface of the reflecting film is formed smoothly.

Moreover, as the material for the bottom layer may be used one or more selected from the group consisting of silane coupling agent, titanium coupling agent, aluminum coupling agent, aluminum-magnesium alloy, aluminum-silane alloy, aluminum-copper alloy, aluminum-manganese alloy, and aluminum-gold alloy.

4. Mirror Reflecting Ratio

The mirror reflecting ratio of the reflecting layer preferably is any value within the range of 5 to 50%.

This is because if the mirror reflecting ratio of the reflecting layer is below 5%, brightness of the resulting display picture may be remarkably deteriorated when being used in the liquid crystal display device. On the other hand, the scattering characteristic is deteriorated, and thus the background is reflected, and the outside light is excessively mirror reflected, if the mirror reflecting ratio is above 50%.

Consequently, the mirror reflecting ratio of the reflecting layer preferably is any value within the range of 10 to 40%, and more preferably 15 to 30%.

Figure 14:
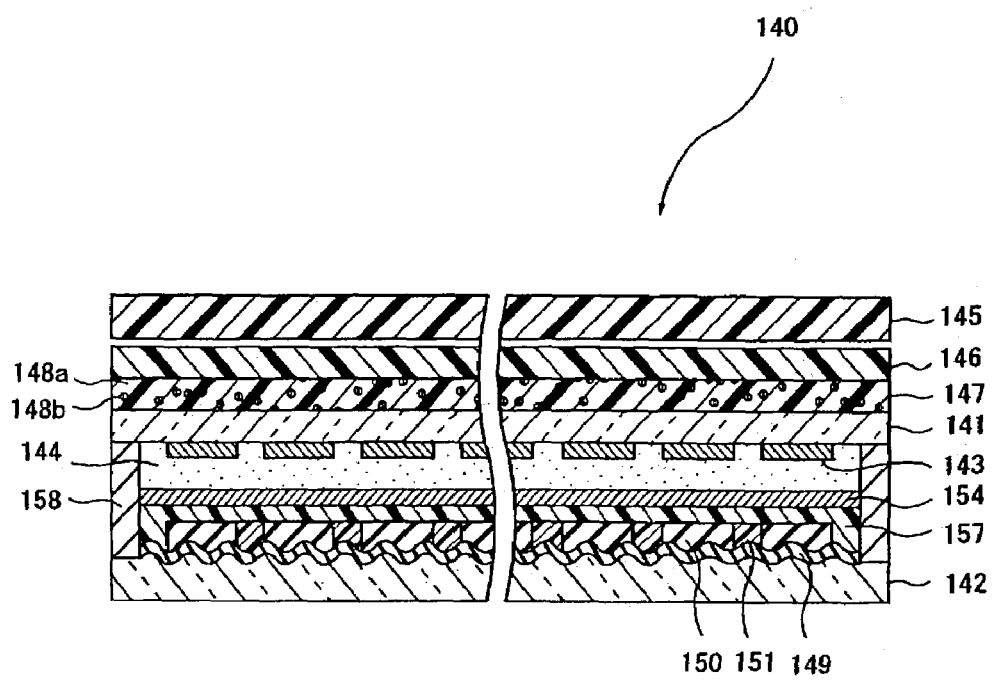
FIG. 14 is a cross-sectional view of an passive matrix liquid crystal display device.
Figure 15:
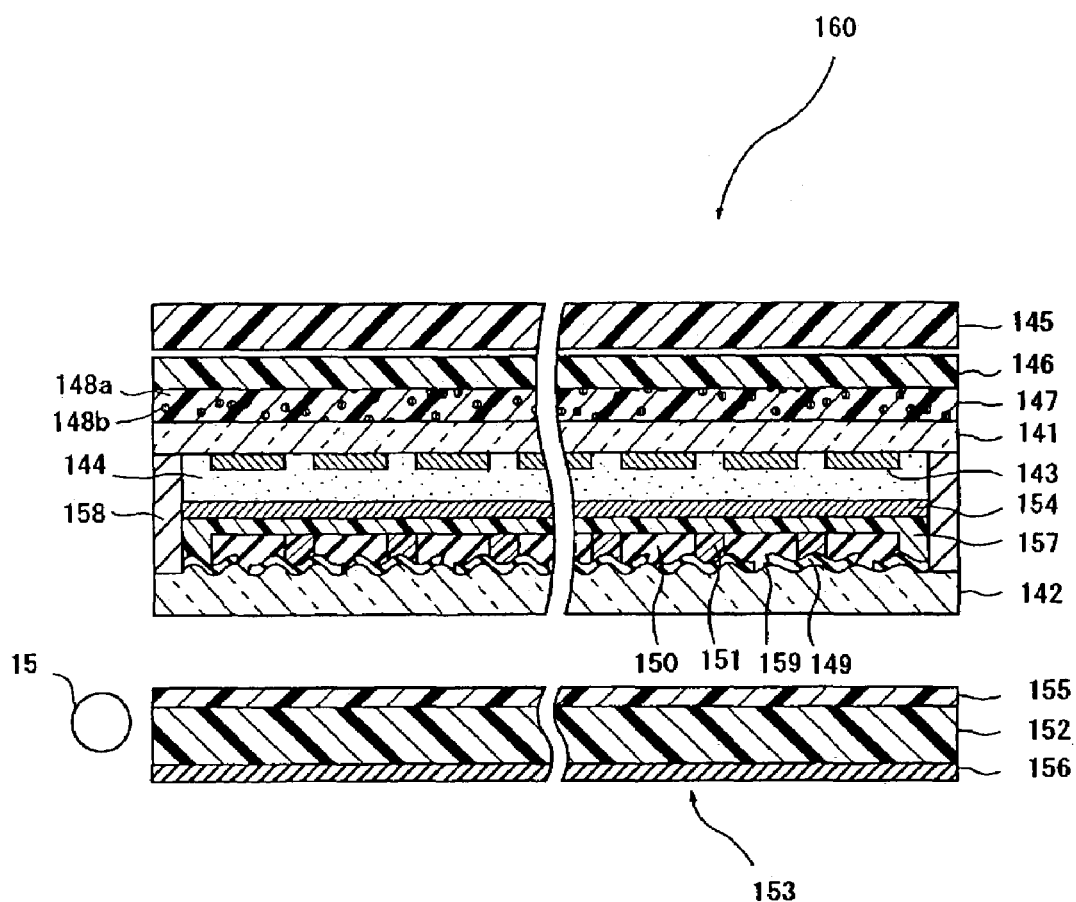
FIG. 15 is a cross-sectional view of another liquid crystal display device.

The aforesaid substrate with the light reflecting film may be combined with other elements, for example, a color filter 150, a shading layer 151, an overcoat layer 157, a plurality of transparent electrodes 154, or an oriented film, as shown in FIGS. 14 and 15.

With reduced generation of the interference fringes or the like, an element, of a color liquid crystal display device, is efficiently provided by the combination as described above. For example, colorization is easily accomplished by combination of the substrate and the color filter 150 of a stripe arrangement, a mosaic arrangement, or a delta arrangement comprising color elements having three colors of RGB (red, green, and blue). Also, pictures with excellent contrast are obtained by combination of the substrate and the shading layer 151. Besides, the substrate with the light reflecting film may be used as the reflecting electrode, and the effect of the reflecting film comprising a plurality of concave portions or the convex portions may be prevented, while absorption of the light may be prevented, for example, by providing another electrode such as the transparent electrode 154.

Instead of the color filter comprising three color elements of the RGB (red, green, and blue), another color filter preferably comprises three color elements of YMC (yellow, magenta, and cyan). The color filter comprising three color elements of the YMC has an excellent light transmittance characteristic, and brighter display can be obtained in case that the color filter is used in the reflection type liquid crystal display device.

Third Embodiment

In a third embodiment of the present invention, the present invention provides a method for forming a light reflecting film on a base having a plurality of dot regions, comprising the steps of: applying a photosensitive material on the base; exposing the photosensitive material; forming concave and convex portions on the exposed photosensitive material; and forming a light reflecting film on the concave and convex portions, wherein the concave and convex portions are formed in predetermined shapes, the predetermined shapes partially overlapping each other, and the patterns of the concave and convex portions are formed irregularly by a plurality of dots less than the number of the dot regions in the dot units.

Specifically, the present invention provides a method for manufacturing a substrate with a light reflecting film, comprising the steps of: forming, by the exposure process, a first base having a plurality of separated concave portions or convex portions randomly arranged over a plane to the applied photosensitive resin, the planar shapes of which are partially overlapped circles and partially overlapped polygons or any one of the partially overlapped circles and the partially overlapped polygons, while the heights thereof are substantially equal, using the mask having the light-transmitting parts or the non-light-transmitting parts whose planar shapes are formed in the shapes of the partially overlapped circles or the partially overlapped polygons or any one of the partially overlapped circles and the partially overlapped polygons, and randomly arranged over a plane; forming, by the exposure process, a second base having a plurality of continuous concave portions or convex portions by applying the photosensitive resin on the surface of the first base; and forming a reflecting layer on the surface of the second base.

Figure 11:
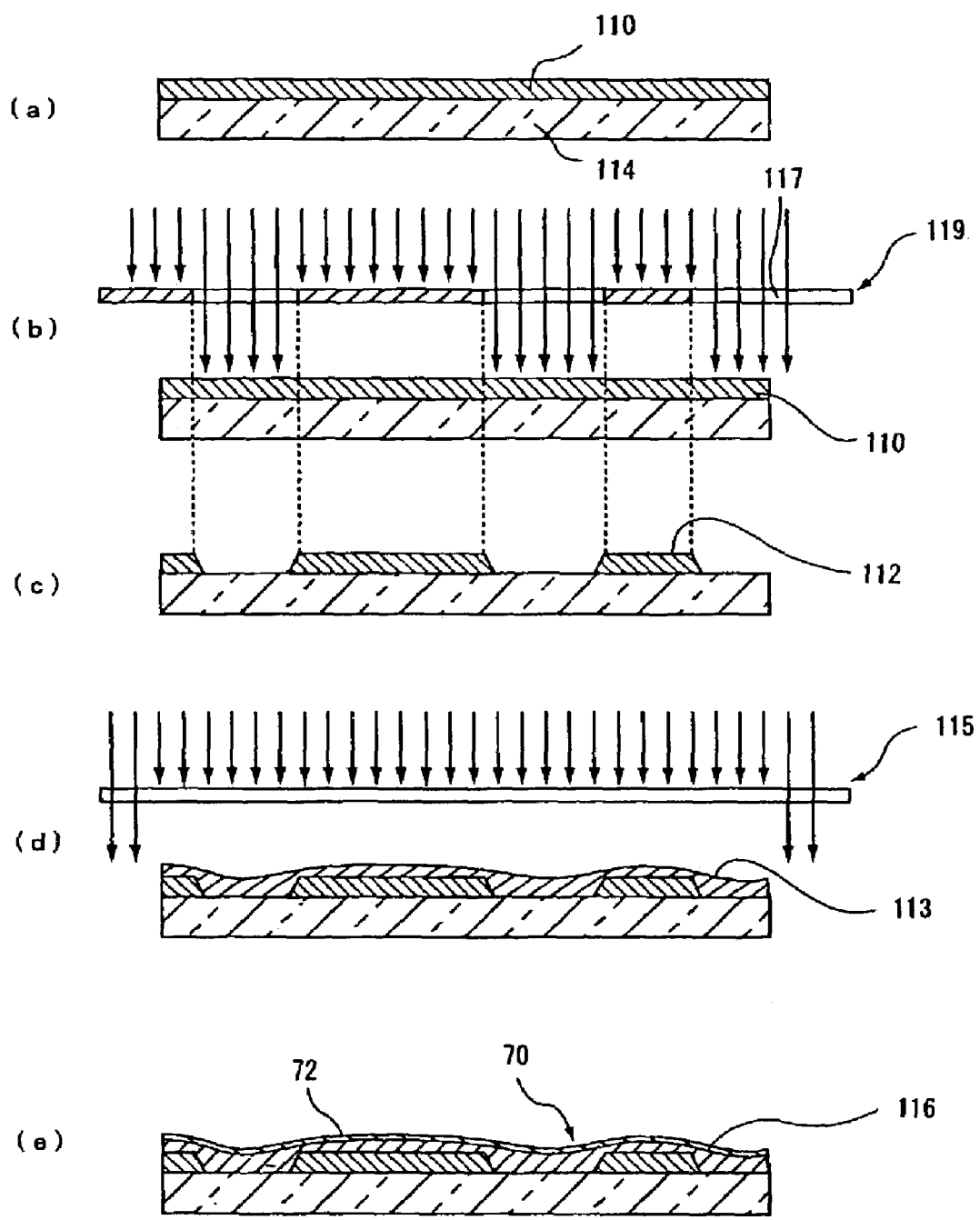
FIGS. 11a–11e illustrate a process for manufacturing a substrate with a light reflecting film.

Now, the method for manufacturing the substrate with the light reflecting film, for example, by forming the concave portions on the surface of the first base, will be specifically described with reference to FIGS. 11 and 12. FIG. 11 shows schematically a manufacturing process of the substrate with the light reflecting film, and FIG. 12 is a flow chart of the manufacturing process of FIG. 11.

Step for Forming First Base

It is preferable that a plurality-of concave portions randomly arranged over a plane is formed by means of the positive type photosensitive resin by the exposure process using the mask described in the first embodiment of the present invention.

That is, a plurality of the separated concave portions whose planar shapes are partially overlapped circles and partially overlapped polygons or any one of the partially overlapped circles and the partially overlapped polygons consist of the photosensitive resin and preferably have shapes corresponding to the mask patterns using the mask having the light-transmitting parts or the non-light-transmitting parts whose planar shapes are formed in the shapes of the partially overlapped circles or the partially overlapped polygons or any one of the partially overlapped circles and the partially overlapped polygons, and randomly arranged over a plane.

(1) Photosensitive Resin

As the photosensitive resin constituting the first base, for example, one or more selected from the group consisting of acryl-based resin, epoxy-based resin, silicon-based resin, phenol-based resin, and oxetane-based resin may be used, although it is not particularly limited. An inorganic filler, such as silica particles, titanium oxide, zirconium oxide, aluminum oxide may be added to the photosensitive resin, so that the predetermined circles or polygons can be formed more accurately.

As mentioned above, as the photosensitive resin constituting the first base, any of following two resins is very useful. One is a positive resin having portions on which the light transmitted through the light-transmitting parts is irradiated may be used, the portions being photolyzed and soluble in a developing agent, and other is a negative resin having portions on which the light transmitted through the light-transmitting parts is irradiated may be used, the portions being exposed to the light and insoluble in the developing agent.

(2) Exposure Process

As indicated in FIG. 11(*a*) and Step P31 of FIG. 12, the photosensitive resin constituting the first base is uniformly applied on a supporting part 114 using a spin coater to form a first layer 100 in forming the first base comprising a plurality of separated concave portions. In this case, it is preferable that conditions of the spin coater are, for example, at 600 to 2,000 rpm and for 5 to 20 seconds.

To improve the resolution, the first layer 110 preferably is pre-baked as indicated in Step P32 of FIG. 12. In this case, the first layer preferably is heated at the temperature of 80 to 120° C. for 1 to 10 minute using a hot plate.

As indicated in FIG. 11(*b*) and Step P33 of FIG. 12, it is preferable that the mask 119 of the first embodiment is disposed on the first layer 110 comprising the uniformly applied photosensitive resin by using the mask 119 of the first embodiment, and then is exposed to an i-ray. In this case, the amount of exposure to the i-ray is preferably between 50 to 300 mJ/cm$^2$.

Next, as indicated in FIG. 11(*c*) and Step P34 of FIG. 12, the portions transmitted through the light-transmitting parts 117 of the mask 119 are positively developed by means of the developing agent. As a result, the first base 112 comprising a plurality of the separated concave portions, which are randomly arranged over a plane, is formed.

Further, prior to forming the second base 113, as indicated in Step P35 of FIG. 12 and FIG. 36, for example, a post exposure is carried out on the whole surface in the amount of the exposure of 300 mJ/cm$^2$, and then post-baked by heating at the 220° C. for 50 minutes. Consequently, the first base 112 becomes further strong and stable.

2. Step for Forming Second Base

In the step for forming the second base, the second base, which is a continuous layer, is formed on the first base, specifically on a plurality of concave portions randomly arranged over a plane by applying the resin.

(1) Photosensitive Resin

As the photosensitive resin constituting the second base, for example, acryl-based resin, epoxy-based resin, silicon-based resin, or phenol-based resin may be used, although it is not particularly limited.

In order to increase the adherent force between the first base and the second base, the photosensitive resin constituting the second base and the photosensitive resin constituting the first base are preferably the same kind.

Furthermore, in order to increase the adherent force between the first base and the second base, it is preferable to apply the silane coupling agent on the surface of the first base.

(2) Exposure Process

As indicated in FIG. 11(d) and Steps P37 to P40 of FIG. 12, it is preferable to apply the photosensitive resin constituting the second base 113 when the second base 113 is formed, and then to remove the resin layer by exposure to the i-ray on the mounting area around a panel display region. In this case, it is also preferable that the exposure amount of the i-ray is any value within the range of 50 to 300 mJ/cm$^2$ similarly to the case that the first base 112 is exposed.

Furthermore, as indicated in Steps P41 and P42 of FIG. 12, after the second base 113 is formed, for example, after the post exposure is carried out on the whole surface in the amount of the exposure of 300 mJ/cm$^2$, the second base is post-baked by heating at the 220° C. for 50 minutes. Consequently, the first base 112 and the second base 113 become further strong and stable, respectively.

3. Step for Forming Reflecting Layer

In the step for forming the reflecting layer, the reflecting layer 116 having a smoothly curved surface is formed on the surface of the second base 113, as indicated in FIGS. 11(e) and Steps P43 and P44 of FIG. 12, whereby the light is properly scattered.

(1) Material for Reflecting Layer

As a material for the reflecting layer, a metallic material with excellent light reflecting ability, for example, such as aluminum (Al), or silver (Ag) preferably is used as described in connection with the second embodiment of the present invention.

(2) Method for Forming Reflecting Layer

It is preferable to form the reflecting layer, for example, using a method such as sputtering method. The material of the reflecting layer located out of the desired portions may be removed by means of the photo etching.

Since the concave and convex portions exist on the surface of the second base, the material of the reflecting layer may not be laminated with a uniform thickness. In this case, it is preferable to adopt a rotary deposition or a rotary sputtering.

It is also preferable that the reflecting layer is formed and the reflecting layer electrically connect to the terminal of a TFT (Thin Film Transistor) or a MIM (Metal Insulating Metal).

Fourth Embodiment

In a fourth embodiment of the present invention, the present invention provides an active matrix liquid crystal display device using a TFD (Thin Film Diode) provided with a diode-type active element as an active element. The active matrix liquid crystal display device comprises a liquid crystal element interposed between two substrates, and a substrate with a light reflecting film disposed on the substrate positioned opposite to the viewing side of the liquid crystal element. The substrate with the light reflecting film includes a base and a light reflecting layer. The depths of a plurality of concave portions formed on the surface of the base or the heights of a plurality of convex portions are substantially equal, the planar shapes of a plurality of concave portions or a plurality of convex portions are the overlapped circles and the overlapped polygons, or any one of the aforesaid circles and polygons, and a plurality of concave portions or the convex portions are randomly arranged over a plane.

Hereinafter, being specifically described with reference to FIGS. 23 to 25, the detail of a semi-transmission and reflection type liquid crystal display device capable of selectively performing a reflection type display using external light and a transmission display using an illuminator will be exemplarily described.

Figure 23:
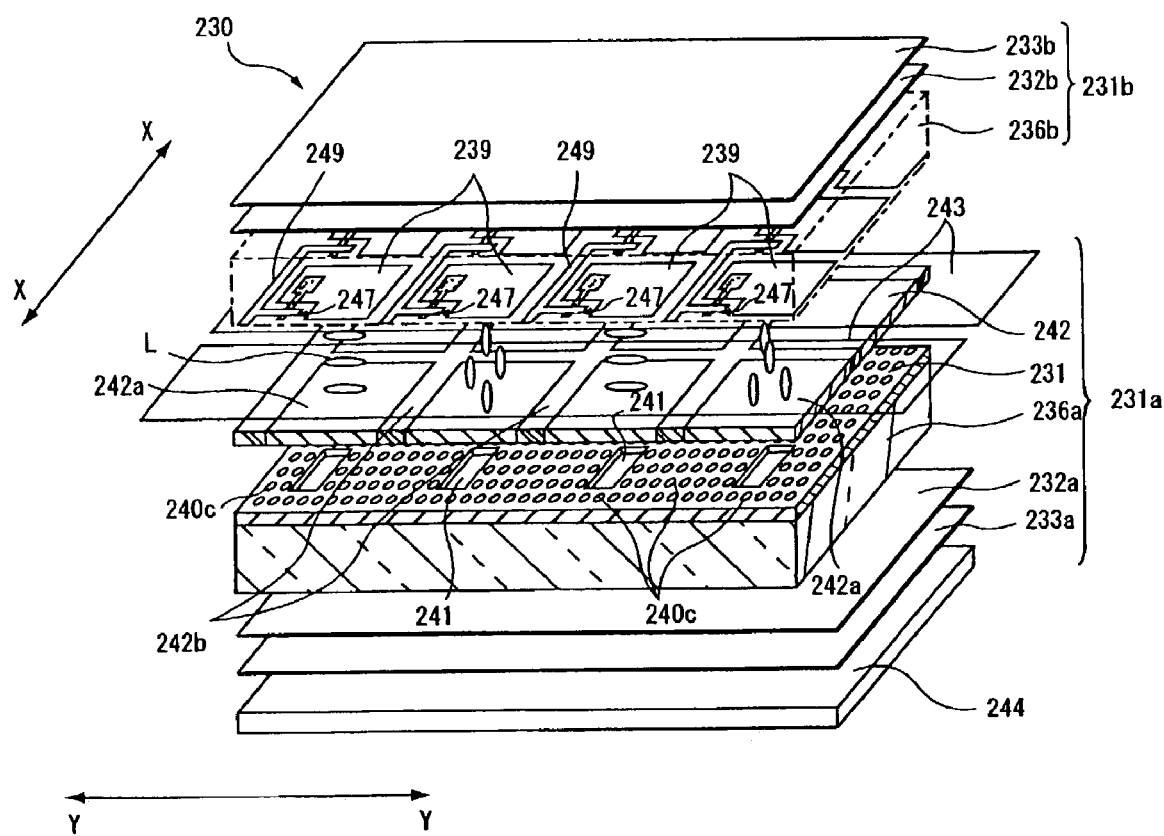
FIG. 23 is an exploded perspective view of a TFD liquid crystal display device.

In accordance with the fourth embodiment of the present invention, as shown in FIG. 23, a liquid crystal display device 230 is formed by attaching a first substrate 231*a* and a second substrate 231*b* to each other using a sealant (not shown) and subsequently injecting a liquid crystal into a gap, i.e., a cell gap, surrounded by the first substrate 231*a*, the second substrate 231*b* and the sealant. Preferably, a liquid crystal activating IC (not shown) is mounted directly on the surface of the second substrate 231*b*, for example, so as to form a COG (Chip on glass) type constitution.

Figure 24:
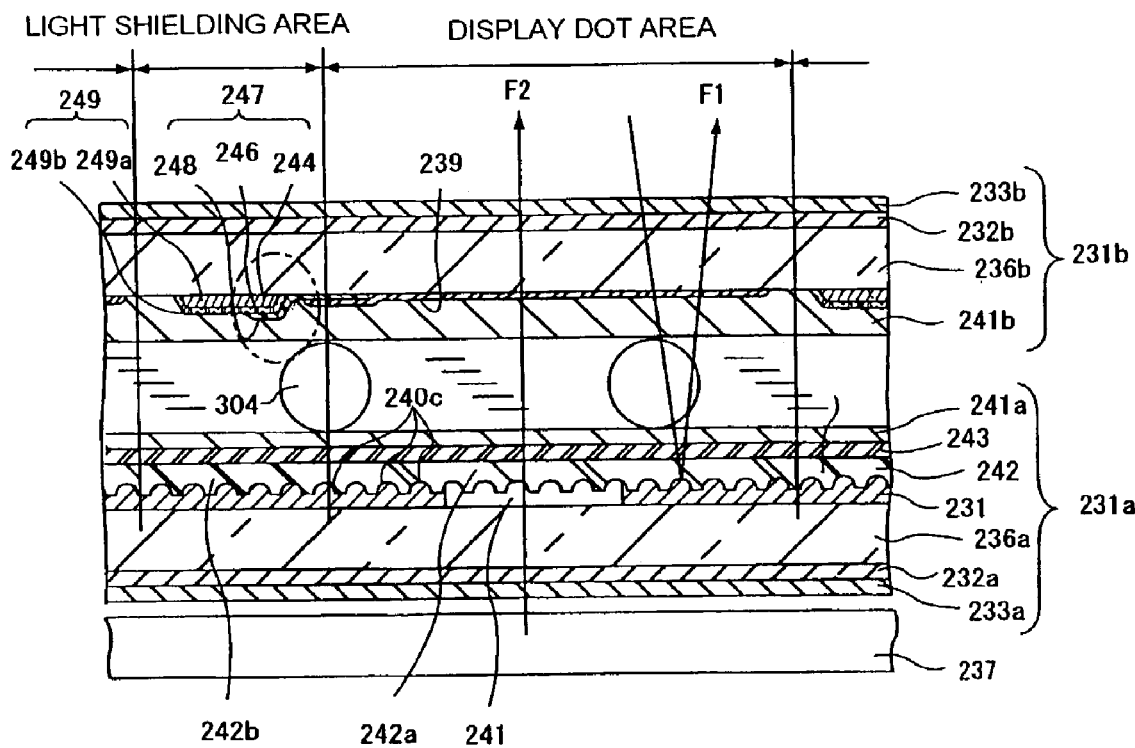
FIG. 24 is a partial cross-sectional view of the TFD liquid crystal display device.
Figure 25:
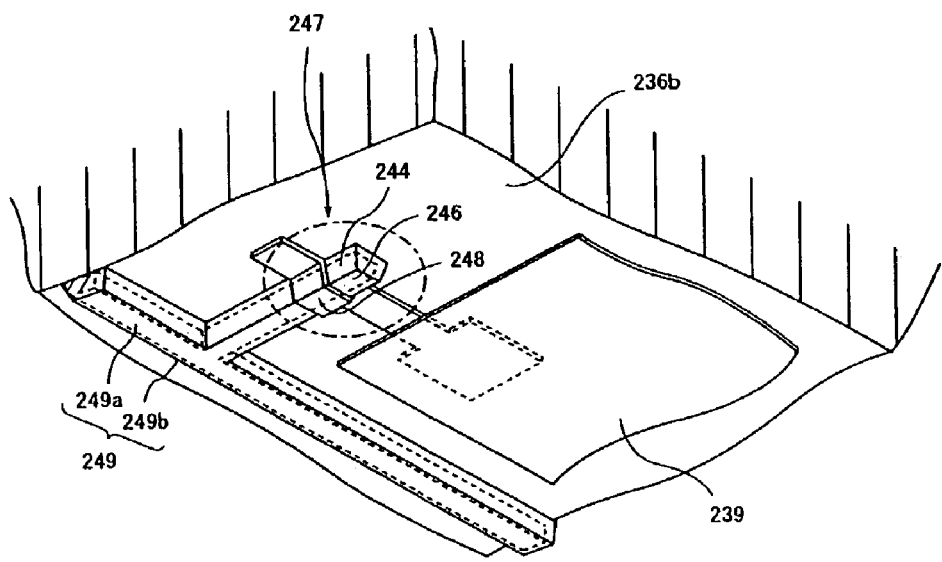
FIG. 25 is a partial perspective view of the TFD liquid crystal display device.
Figure 26:
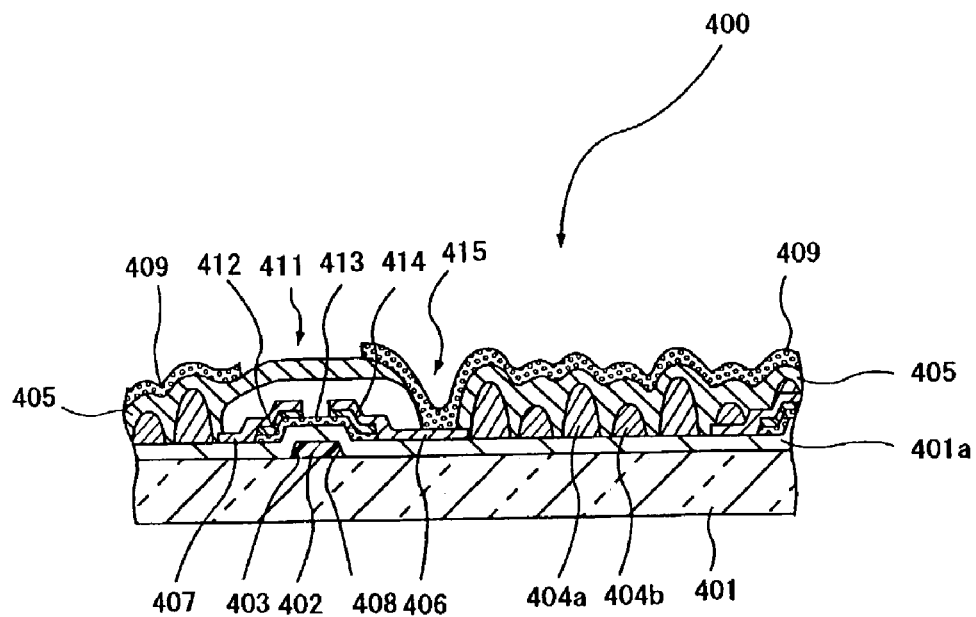
FIG. 26 is a cross-sectional view of a conventional liquid crystal display device.
Figure 27:
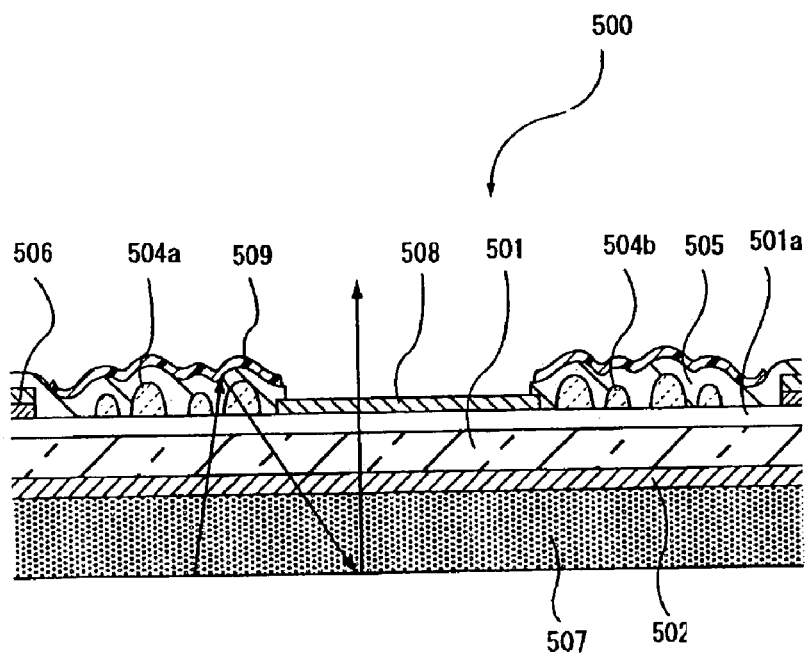
FIG. 27 is a cross-sectional view of a specific configuration of a conventional liquid crystal display device.
Figure 29:
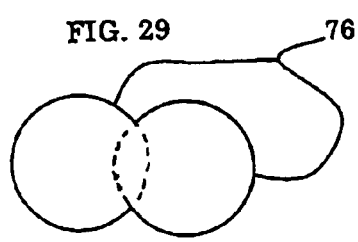
FIG. 29 is a first example of overlapping convex/concave portions of a light reflecting film.
Figure 30:
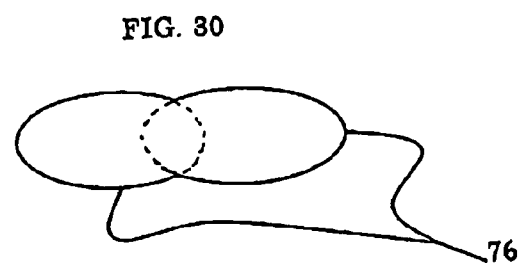
FIG. 30 is a second example of overlapping convex/concave portions of a light reflecting film.
Figure 31:
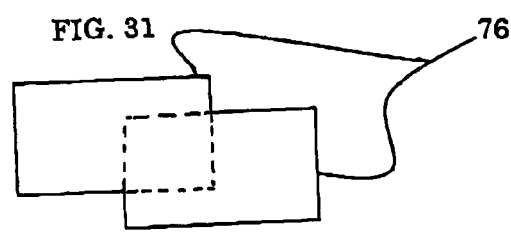
FIG. 31 is a third example of overlapping convex/concave portions of a light reflecting film.
Figure 32:
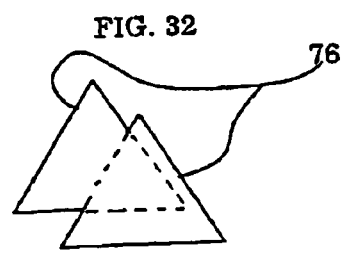
FIG. 32 is a fourth example of overlapping convex/concave portions of a light reflecting film.
Figure 33:
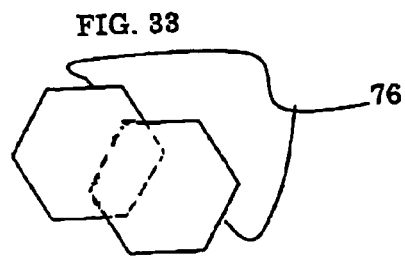
FIG. 33 is a fifth example of overlapping convex/concave portions of a light reflecting film.

FIG. 23 is a enlarged view of a plurality of a cross structure of a plurality of display dot included on one display area of the liquid crystal display device 230, and FIG. 24 shows a cross-sectional view illustrating one display dot.

As shown in FIG. 23, a plurality of pixel electrodes are formed within the inner area of the second substrate 231*b* surrounded by the sealant so as to be arranged in a dot matrix shape in a crosswise direction of X—X and a lengthwise direction of Y—Y. An electrode in a stripe shape is formed within the inner area of the first substrate 231*a* surrounded by the sealant. Such stripe-shaped electrode of the first substrate 231*a* is positioned opposite to a plurality of the pixel electrodes of the second substrate 231*b*.

Further, a liquid crystal injection portion by the stripe-shaped electrode on the first substrate 231*a* and one of the pixel electrodes on the second substrate 231*b* forms one display dot. The display area is formed by the dot matrix-shaped arrangement within an inner area of a plurality of the display dot surrounded by the sealant. The liquid crystal activating IC applies selectively a scan signal and a data signal between the opposite electrodes within the plural display dot, thereby controlling the orientation of the liquid crystal each display dot. That is, light passing through the liquid crystal is modulated by controlling the orientation of the liquid crystal. Accordingly, an image such as a character and a number is displayed within the display area.

With reference to FIG. 24, the first substrate 231*a* comprises a base 236*a* made of glass, plastic, etc., a light reflecting film 231 formed on the inner surface of the base 236*a*, a color filters 242 formed on the light reflecting film 231, and a transparent stripe-shaped electrodes 243 formed on the color filters 242. An oriented film 241*a* is formed on the stripe-shaped electrodes 243. As an orientation treatment, a rubbing treatment performed on the oriented film 241*a*. The stripe-shaped electrodes 243 are made of transparent conductive material such as ITO (Indium Tin Oxide), etc.

Further, the second substrate 231*b*, positioned opposite to the first substrate 231*a*, comprises a base 236*b* made of glass, plastic, etc., a TFDs (Thin Film Diode) 247 functioning as an active element serving as a switching element, formed on the inner surface of the base 236*b*, and a pixel electrodes 239 connected to the TFDs 247. An oriented film 241*b* is formed on the TFDs 247 and the pixel electrodes 239. As an orientation treatment, a rubbing treatment to the oriented film 241b is performed. The pixel electrodes 239 are made of transparent conductive material such as ITO (Indium Tin Oxide), etc.

The color filters 242 of the first substrate 231a, include a filter element 242a made of one of various chrominance components such as R (red), G (green) and B (blue), or Y (yellow), M (magenta), C (cyan) and etc in position opposite to the pixel electrodes 239 of the second substrate 231b. Preferably, the color filters 242 include a black masks 242b in position non-opposite to the pixel electrodes 239.

As shown in FIG. 24, a dimension of the gap between the first substrate 231a and the second substrate 231b, i.e., the cell gap, is maintained by ball-shaped spacers 304 dispersed on the surface of one of the two substrates 231a and 231b. The liquid crystal is injected into such cell gap.

Here, TFD 247, as shown in FIG. 24, includes a first metal layer 244, an insulating layer 246 formed on the surface of the first metal layer 244, and a second metal layer 248 formed on the insulating layer 246. Such TFD 247 has a laminated constitution of the first metal layer/the insulating layer/the second metal layer, what is called a MIM (Metal Insulator Metal) constitution.

The first metal layer 244 is made of, for example, a pure tantalum (Ta) or a tantalum (Ta) alloy. In case that the first metal layer 244 is made of a tantalum (Ta) alloy, elements belonging to groups 6 to 8 in the periodic table, such as tungsten, chromium, molybdenum, rhenium, yttrium, lanthanum, dysprosium, etc. are added to tantalum, i.e., a principal element.

Further, the first metal layer 244 is formed integrally with a first layer 249a of a line wiring 249. Such line wiring 249 is stripe-shaped and provided with the pixel electrode 239 therebetween and serve as a scanning line for providing a scan signal to the pixel electrode 239, or as a data line for providing a data signal to the pixel electrode 239.

The insulating layer 246 is made of, for example, tantalum oxide ($Ta_2O_5$) obtained by oxidizing the surface of the first metal layer 244 by an anodizing method. When the first metal layer 244 is anodized, the surface of the first layer 249a of the line wiring 249 is oxidized at the same time. Thereby, a second layer 249b made of tantalum oxide (Ta) identically is formed.

The second metal layer 248 is made of, for example, conductive material such as chromium (Cr). The pixel electrode 239 is formed on the surface of the base 236b so that the pixel electrode 239 is partially overlapped with the end of the second metal layer 248. In addition, a base layer made of tantalum oxide, etc. can be formed on the surface of the base 236b before the first metal layer 244 and the first layer 249a of the line wiring 249 are formed on the base 236b. This is because such base layer prevents the first metal layer 244 from separating from the base substrate by heating treatment after the lamination of the second metal layer 248, and prevents spraying the impurities from dispersing on the first metal layer 244.

The light reflecting film 231, formed on the first substrate 231a, is made of, for example, a metal having light reflectivity such as aluminum (Al). The light reflecting film 231 includes openings 241 for transmitting light, in the position corresponding to the pixel electrodes 239 of the second substrate 231b, i.e., display dot. Preferably, mountain or valley portions, for example, oval or dome-shaped mountain or valley portions 80, 84, 180, 190, 200, 210 and 220 as show in FIGS. 8 and 18 to 22, are formed on the liquid crystal-side of the light reflecting film 231. That is, the mountain or valley portions 80, 84, 180, 190, 200, 210 and 220 are preferably arranged with the direction X, which is a direction of extension of the line wiring, as the major axis, and the direction Y, which is perpendicular to the direction X, as the minor axis. Preferably, the direction of the major axis X of the mountain or valley portions 80, 84, 180, 190, 200, 210 and 220 is set to be parallel to edge extending to the direction X—X of the base, and the direction of the minor axis Y is set to be parallel to edge extending to the direction Y—Y of the base substrate.

Since the liquid crystal display device 230 of the fourth embodiment has the above-described constitution, in case that the liquid crystal display device 230 performs a reflection type display operation, as shown in FIG. 23, external light, incident from the side of an external viewer, i.e., from the side of the second substrate 231b to the inside of the liquid crystal display device 230 passes through the liquid crystal, and subsequently reaches the light reflecting film 231. Then, the external light is reflected on the light reflecting film 231, and returns to the liquid crystal (with reference to arrow F1 in FIG. 24). By a voltage applied between the pixel electrodes 239 and the stripe-shaped counter electrode 243, i.e., by a scan signal and a data signal, the liquid crystal is controlled its orientation every display dot. Thereby, the reflected light provided to the liquid crystal is modulated every display dot, thus allowing an image such as a character and a number to be displayed to viewer side.

On the other hand, in case that the liquid crystal display device 230 performs a transmission type display operation, an illuminator (not shown) located on the outer side of the first substrate 231a, i.e., a back light, emits light. The emitted light passes through a polarizing plate 233a, a phase difference plate 232a, the base 236a, the opening 241 of the light reflecting film 231, the color filter 242, the electrode 243, and the oriented film 241a, and is subsequently provided to the liquid crystal (with reference to arrow F2 in FIG. 24). After that, the transmission type display operation is carried out similarly to the reflection type display operation.

In the fourth embodiment, a plurality of concave portions or the convex portions, the planar shapes which are the overlapped circles and the overlapped polygons or any one of the overlapped circles and the overlapped polygons, are formed on the substrate with the light reflecting film, and a plurality of concave portions or a plurality of convex portions is randomly arranged over a plane while the heights thereof are substantially equal. Accordingly, it is possible to reduce generation of interference fringes.

Further, in the fourth embodiment, as described above, in case that the three-dimensional shapes of the plural concave portions or convex portions along the X axis and the three-dimensional shapes of the plural concave portions or convex portions along the Y axis are different from each other, the amount of the light reflected at a designated viewing angle can be reduced. Thereby, it is possible to increase the amount of the light reflected at other viewing angles. As a result, a viewer can see a brighter image displayed within the display area of the liquid crystal display device at a specific viewing angle when the reflection type display operation is performed by using the light reflecting film.

Fifth Embodiment

In a fifth embodiment of the present invention, the present invention provides a liquid crystal display device, particularly a passive matrix reflecting liquid crystal display device comprising a liquid crystal element interposed between two substrates, and a substrate with light reflecting film formed on the substrate being located at the side opposite to the viewing side of the liquid crystal element. The substrate with light reflecting film includes a base and a reflecting layer. The depths of a plurality of concave portions formed on the surface of the base or the heights of a plurality of convex portions formed on the surface of the base are substantially equal, the planar shapes of a plurality of concave portions or the convex portions are the overlapped circles and the overlapped polygons, or any one of the aforesaid circles and polygons, and a plurality of concave portions or the convex portions are randomly arranged over a plane.

Hereinafter, with reference to FIG. 14, an passive matrix reflecting-type liquid crystal display device of the fifth embodiment is described in detail. Herein, the enlarged scale of each layer and each member in the drawings may be different for a better understanding of the present invention.

1. Constitution

As shown in FIG. 14, the liquid crystal display device 140 has a configuration such that a first substrate 141 and a second substrate 142, which is positioned opposite to each other, are attached by a sealant 158 therebetween, and a liquid crystal 144 is injected between the two substrates. Further a light transmitting protective plate 145 is located on the viewing side of the liquid crystal display device 140. Such protective plate 145 is a plate-shaped member functioning to protect the liquid crystal display device 140 against external impact. For example, the protective plate 145 is installed on a case of an electronic apparatus provided with the liquid crystal display device 140 mounted thereon. The protective plate 145 is positioned adjacent to the surface of the first substrate 141 (the substrate located on the viewing side) in the liquid crystal display device 140. In the fifth embodiment, it is assumed that the protective plate 145 made of plastic lies adjacent to the surface of a polarizing plate 146 being closest to the display side among the components of the first substrate 141. When the protective plate 145 is made of plastic, it is advantageous in terms of the molding and cost of production. However, fine concave and convex portions are easily formed on the surface of the protective plate 145.

The first substrate 141 and the second substrate 142 of the liquid crystal display device 140 are plate-shaped members having light permeability such as glass, quartz, plastic, etc. A plurality of transparent electrodes 143 extending to a designated direction are formed on the inside surface (on the side of the liquid crystal 144) of the first substrate 141 arranged on the viewing side. Each transparent electrode 143 is an stripe-shaped electrode made of transparent conductive material such as ITO (Indium Tin Oxide). The surface of the first substrate 141 provided with the transparent electrodes 143 is coated with the oriented film (not shown). Such oriented film is a thin film organic film such as polyamide. A rubbing treatment is performed on the oriented film so as to determine the orientation of the liquid crystal 144 when a voltage is not applied thereto.

2. Light Scattering Film

The polarizing plate 146 for polarizing incident light in a designated direction and a scattering layer 147 interposed between the first substrate 141 and the polarizing plate 146 are formed on the outer side of the first substrate 141 (the side positioned opposite to the liquid crystal 144). The scattering layer 147 serves to scatter light passing through the scattering layer 147. The scattering layer 147 includes an adhesive agent 148a for adhering the polarizing plate 146 to the first substrate 141, and fine particles 148b dispersed within the adhesive agent 148a. For example, in the scattering layer 147, the adhesive agent 148a is made of acryl-based or epoxy-based material, and the fine particles 148b dispersed in the adhesive agent 148a are made of silica. The refractivity of the adhesive agent 148a differs from the refractivity of the fine particle 148b. The incident light on the scattering layer 147 is refracted at an interface between the adhesive agent 148a and the fine particle 148b. As a result, it is possible to emit the incident light on the scattering layer 147, under the condition that the incident light is scattered to a proper degree.

In the scattering layer 147 of the fifth embodiment of the present invention, the number of the fine particles 148b dispersed in the adhesive agent 148a and the refractivities of fine particles 148b and the adhesive agent 148 are designated so that the haze value H is in the range of 10 to 60%. Here, the haze value H represents the degree of the light scattering at the moment when the incident light on a member transmits the member, and is defined by the below equation.

$$\text{haze Value } H = (Td/Tt) \times 100(\%)$$

Here, Tt denotes transmittance of whole light (%), and Td denotes transmittance of scattered light (%). The transmittance of whole light Tt (%) refers to the ratio of the amount of passing through a sample to the amount of incident light on the sample, the sample being a target of measurement of the haze value H, of the amount of light passing through the sample. On the other hand, in case light is irradiated from predetermined directions to the sample, the transmittance (%) of the scattered light Td is the ratio of the amount of light emitted into the directions other than the designated direction (i.e., the amount of scattered light) to the amount of light passing through the sample. That is, if a transmittance of parallel light Tp (%) refers to the ratio of the amount of light emitted from the sample and being parallel with the incident light, to the total amount of light emitted from the sample, the transmittance of scattered light Td (%) is the difference between the transmittance (of whole light Tt (%)) and the transmittance of parallel light Tp (%) (Td=Tt−Tp). In case that the haze value H is large, the degree of the light scattering is high (that is, the ratio of the amount of scattered light to the amount of the transmitted light is large). On the other hand, in case that the haze value H is small, the degree of the light scattering is low (that is, the ratio of the amount of scattered light to the amount of the transmitted light is low).

The above-described haze value H is described in detail in JIS (Japanese Industrial Standards) K6714-1977.

3. Reflecting Layer (Light Reflecting Film)

A reflecting layer 149 is formed on the inner surface of the second substrate 142 (on the side of the liquid crystal 144). Such reflecting layer 149 serves to reflect light entered from the viewing side, positioned opposite to the liquid crystal display device 140. The reflecting layer 149 is made of a metal having optical reflectivity, such as aluminum or silver.

As shown in FIG. 14, an area coated with the reflecting layer 149 of the inner surface of the second substrate 142 has an uneven surface including a plurality of protrusions and concavities. More specifically, in the light reflecting film including the base and the reflecting layer 149, the plurality of concave portions or the plurality of convex portions formed on the surface of the base have the same height or depth. The planar shapes of the concave portions or the convex portions are the overlapped circles and the overlapped polygons, or any one of the overlapped circles and the overlapped polygons. The plural concave portions or convex portions are randomly arranged on the plane of the reflecting layer 149.

Therefore, the surface of the reflecting layer 149 is also uneven based on the unevenness of the surface of the second substrate 142 including the protrusions and concavities. That is, the reflecting layer 149 has a scattering constitution providing a broad viewing angle so as to scatter the light reflected by the reflecting layer 149 in a proper degree. More specifically, the reflecting layer 149 is formed on the base including a plurality of concave portions or convex portions. The heights of a plurality of convex portions formed on the surface of the base are substantially equal. The planar shapes of a plurality of concave portions or the convex portions are the overlapped circles and the overlapped polygons, or any one of the aforesaid circles and polygons. A plurality of concave portions or the convex portions are randomly arranged over a plane.

4. Other Components

The color filter 150, the light shielding layer 151, the overcoat layer 157 for the planarization of the uneven surfaces formed by the color filter 150 and the light shielding layer 151, a plurality of transparent electrodes 154, and an oriented film (not shown) are formed on the surface of the reflecting layer 149 covering the second substrate 142.

Each transparent electrode 154 is a stripe-shaped electrode extended in a direction (in a horizontal direction of FIG. 14), being intersected to the extending direction of the transparent electrodes 143 on the first substrate 141. In the same manner as the transparent electrode 143, each transparent electrode 154 is made of a transparent conductive material such as ITO (Indium Tin Oxide).

In this structure, the orientation of the liquid crystal 144 is changed by a voltage applied between the transparent electrodes 143 and the transparent electrodes 154. That is, an area where the transparent electrodes 143 and the transparent electrodes 154 intersect each other functions as a pixel (sub-pixel). The color filter 150 is a resin layer corresponding to each of such pixels, and has any one color of R, G, or B using dyes and pigments.

The light shielding layer 151 is formed in a lattice-type constitution so as to shield a pitch portion between pixels. For example, the light shielding layer 151 is made of a black resin material sprayed with carbon black.

5. Operation

The reflection type display operation is performed by the above-described constitution. That is, the external light such as sunlight or indoor electric light transmits the protective plate 145, to be incident on the liquid crystal display device 140, and be subsequently reflected at the surface of the reflecting layer 149.

Such reflected light transmits the liquid crystal 144 and the first substrate 141, is properly scattered by the scattering layer 147, transmits the polarizing plate 146, and is emitted to the viewing side of the liquid crystal display device 140. The light emitted from the liquid crystal display device 140 transmits the protective plate 145 and then is displayed to a viewer.

As described above, in case that the protective plate 145 is made of plastic, it is difficult to form a completely flat surface of the protective plate 145. Further, a plurality of fine concave and convex portions are easily formed on the surface of the protective plate 145. In case that such protective plate 145 provided with the fine concave and convex portions is located close to the first substrate 141 of the liquid crystal display device 140, when light emitted from the liquid crystal display device 140 permeates the protective plate 145, the light interferes with the protective plate 145. Accordingly, interference fringes corresponding to the concave and convex portions are overlapped with display images, thereby degrading the display quality.

However, as a result obtained by the work of the present inventors, as shown in the above-described embodiment, when light reaches the protective plate 145 by passing the liquid crystal 144, and it is scattered by the scattering layer 147, it is possible to increase the display quality.

In the constitution of FIG. 14, in order to reduce the occurrence of the interference fringes, it is preferable that the haze value H of the scattering layer 147 is set to be large, i.e., to a high degree of the light scattering. However, when the haze value H is extremely large, for example, not less than 70%, light reaching the protective plate 145 from the liquid crystal display device 140 is excessively scattered, thereby degrading the contrast of the displayed image. Further, there occurs a new problem such as a faint display image. On the other hand, when the haze value H of the scattering layer 147 is extremely small, for example, not more than 10%, stains due to the concave and convex portions can be seen.

As a result of the repeated experiments, the inventors of the present invention have come to the conclusion that it is preferable that the haze value H of the scattering layer 147 is any value within the range of 40 to 60% in case that the patterns formed by the concave portions or the convex portions are randomly arranged in one unit defined by one dot or two dot unit. Any deterioration of the display quality due to the convex and concave constitutions of the surface of the protective plate 145 is efficiently prevented, while any considerable deterioration of contrast of the displayed images is prevented, and thus fine display quality is ensured.

Further, if the haze value H of the scattering layer 147 is any value within the range of 10 to 40% in case that the patterns formed by the concave portions or the convex portions are randomly arranged in three or more dot units, the contrast can be set high.

In the fifth embodiment, in case the scattering layer 147 including the fine particles 148b dispersed in the adhesive agent 148a is used, the haze value H can be arbitrarily set by controlling the amount (the number) of the fine particles 148b to be added.

That is, if the amount of the fine particles 148b added to the adhesive agent 148a is increased, since the incident light to the scattering layer 147 is more widely scatter, the haze value H of the scattering layer 147 can be increased. On the other hand, the haze value H of the scattering layer 147 can be decreased by decreasing the amount of the fine particles 148b added to the adhesive agent 148a.

The liquid crystal display device 140 of the fifth embodiment is advantageous in terms of easily setting the scattering degree of the light emitted from the liquid crystal display device 140 within a broad range. That is, in a liquid crystal display device without the scattering layer 147, in order to adjust the scattering degree of the light emitted from the liquid crystal display device 140, it is necessary to adjust the shape of the surface of the reflecting layer 149, for example, the depths of the concave portions and the heights of the convex portions, or the distance between the neighboring concave portions or convex portions.

However, since it requires technical skill to form the desirable shapes of concave and convex portions on the second substrate 142, it is not always easy to precisely form the desirable shape of the surface of such reflecting layer 149. Further, the adjustable range of the scattering degree of the light emitted from the liquid crystal display device 140 only by controlling the shape of the surface of the reflecting layer 149 is limited to an extremely narrow range.

On the other hand, in this embodiment, although the shape of the surface of the reflecting layer 149 is not extensively changed, the scattering degree of the light emitted from the liquid crystal display device 140 is broadly and easily adjusted by changing the haze value H of the scattering layer 147, for example, by properly adjusting the amount of the fine particles 148b added to the adhesive agent 148a.

Sixth Embodiment

In a sixth embodiment of the present invention, a passive matrix semi-transmitting/reflecting-type liquid crystal display device comprises a liquid crystal element interposed between two substrates, and a substrate with light reflecting film formed on the substrate being located opposite to a display side of the liquid crystal element. The substrate with light reflecting film includes a base and a reflecting layer. The depths of a plurality of concave portions formed on the surface of the base or the heights of a plurality of convex portions formed on the surface of the base are substantially equal, the planar shapes of a plurality of concave portions or the convex portions are the overlapped circles and the overlapped polygons, or any one of the aforesaid circles and polygons, and a plurality of concave portions are the convex portions is randomly arranged over a plane.

Hereinafter, with reference to FIG. 15, the passive matrix semi-transmitting/reflecting-type liquid crystal display device of the sixth embodiment is described in detail.

1. Basic Constitution

As shown in FIG. 15, in the sixth embodiment, a back light unit 153 is located on the rear side of a liquid crystal display device 160 (located opposite to the display side). Such back light unit 153 includes a plurality of LEDs 15 (only one LED is shown in FIG. 15) functioning as light sources, a light guide plate 152, a diffusion plate 155, and a reflecting plate 156. The light guide plate 152 guides the light from the LED 15 and incident on its side end surface, toward the whole surface of the second substrate 142 of the liquid crystal display device 160. The diffusion plate 155 diffuses uniformly the light guided by the light guide plate 152 throughout the liquid crystal display device 160. The reflecting plate 156 reflects light, which is emitted from the light guide plate 152 onto the side located opposite to the liquid crystal display device 160, on the side of the liquid crystal display device 160.

Here, the LED 15 is not always turned on. In case that the LED 15 is used under conditions of few external light, the LED 15 is turned on by the instruction from a user or the detection signal from a sensor.

In the liquid crystal display device 160 of the sixth embodiment, openings 159 are formed in portions of the reflecting layer 149, corresponding to central portions of pixels. Another polarizing plate is attached to the outer side of the second substrate 142 (the side located opposite to the liquid crystal 144). However, such polarizing plate is omitted in FIG. 15.

2. Operation

The liquid crystal display device 160 having the above-described constitution performs the transmission type display operation as well as the reflection type display operation described in the fifth embodiment. That is, the light irradiated from the back light unit 153 to the liquid crystal display device 160 passes through the openings 159 of the reflecting layer 149. Such light transmits the liquid crystal 144 and the first substrate 141, is scattered by the scattering layer 147, transmits the polarizing plate 146, and is subsequently emitted on the viewing side of the liquid crystal display device 160. The transmission type display operation is performed by allowing the emitted light to pass through the protective plate 145 and to be subsequently emitted on the viewing side.

In this embodiment, like the sixth embodiment, even if the protective plate 145 including the fine concave and convex portions on its surface is located close to the liquid crystal display device 160, the degrading of display quality due to the above uneven surface constitution of the protective plate 145 can be prevented.

Seventh Embodiment

In a seventh embodiment of the present invention, a modified liquid crystal display device comprises a liquid crystal element interposed between two substrates, and a light reflecting film formed on the substrate at the side located opposite to the viewing side of the liquid crystal element. The substrate with light reflecting film includes a base and a reflecting layer. The depths of a plurality of concave portions formed on the side of the surface of the base and the heights of a plurality of convex portions formed on the surface of the base are substantially equal, the planar shapes of a plurality of concave portions or the convex portions are the overlapped circles and the overlapped polygons, or any one of the aforesaid circles and polygons, and a plurality of concave portions or the convex portions are randomly arranged over a plane.

(1) First Modification

Although the scattering layer 147 is positioned between the first substrate 141 and the polarizing plate 146 in the above-described embodiments, the position of the scattering layer 147 may not be limited thereto. For example, in case that a phase difference plate for compensating an interference color is positioned between the polarizing plate 146 and the first substrate 141, the scattering layer 147 may be interposed between the phase difference plate and the first substrate 141, or between the phase difference plate and the polarizing plate 146. In short, the scattering layer 147 may be located on the side of the protective plate 145, positioned opposite to the liquid crystal 144.

In the above-described embodiments, the scattering layer 147 in which the plurality of fine particles 148b is dispersed in the adhesive agent 148a is used. However, the constitution of the scattering layer 147 is not limited thereto. The scattering layer 147 may be any layer by which the incident light can be scattered. If the scattering layer 147 includes the adhesive agent 148a, members provided with the scattering layer 147 interposed therebetween (for example, the first substrate 141 and the polarizing plate 146 in the above described embodiment) are attached by the adhesive agent 148a. Accordingly, compared to the scattering layer 147 without the adhesive agent 148a, it is possible to reduce the manufacturing cost and to simplify the manufacturing process.

(2) Second Modified Example

The fifth embodiment describes the reflecting-type liquid crystal display device, and the sixth embodiment describes the semi-transmission and reflection type liquid crystal display device. However, the present invention may be applied to a transmission type liquid crystal display device performing only transmission operation without the reflecting layer 149. That is, the transmitting-type liquid crystal display device is formed by removing the reflecting layer 149 from the semi-transmission and reflection type liquid crystal display device of FIG. 15.

Further, though the reflecting layer 149 having a openings 159 performs both of transmission type display and reflection type display in the fourth embodiment, the present invention may be applied to a semi-transmission and reflection type liquid crystal display device using a half mirror, which passes a part of irradiated light and reflects the remaining part of the light, as a substitute for the reflecting layer 149.

(3) Third Modification

The above-described embodiments describe the protective plate 145 made of the plate-shaped plastic member. Since the unevenness is easily formed on the surface of the protective plate 145, it can be obtained a remarkable effect by applying the present invention. However, the material of protective plate 145 is not limited to the above material, but may be made of plate-shaped members of various materials.

(4) Fourth Modified Example

Although the above-described embodiments describe the color filter 150 and the light shielding layer 151 formed on the second substrate 142, the present invention may be applied to a liquid crystal display device provided with such components formed on the first substrate 141, and a liquid crystal display device without the color filter 150 or the light shielding layer 151. Moreover, the present invention may be applied to the liquid crystal display device 160 provided with the protective plate 145 located close to the viewing side regardless of the conditions of such components.

(5) Fifth Modified Example

Figure 13:
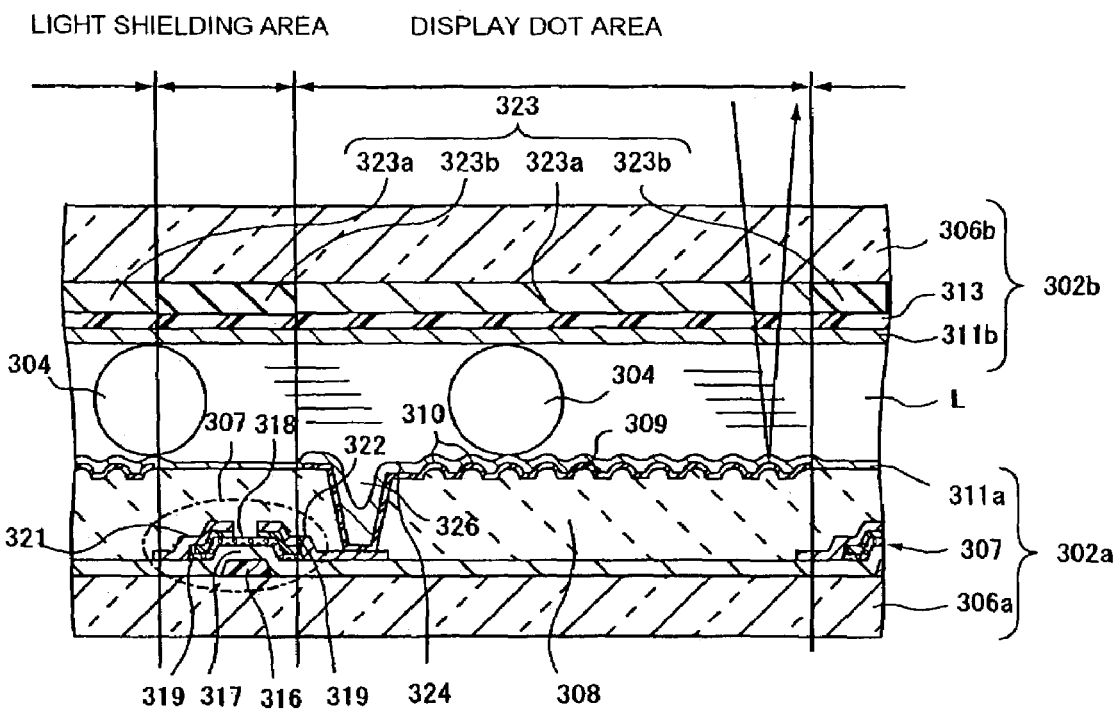
FIG. 13 is a cross-sectional view of a substrate with a light reflecting film electrically connected to a TFT element.

Although the above fourth embodiment describes the active matrix liquid crystal display device using the TFD of diode active element as a diode active element, as shown in FIG. 13, the present invention may be applied to an active matrix liquid crystal display device using a TFT as a triode active element as an active element. In this case, as shown in FIG. 13, preferably, the TFT element is formed on a shield area.

Eighth Embodiment

In an eighth embodiment of the present invention, the present invention provides an electronic apparatus comprising a liquid crystal display device having a substrate with a light reflecting film is provided, wherein the substrate with the light reflecting film comprises a base and the light reflecting film, the depths of a plurality of concave portions formed on the base and the heights of a plurality of convex portions formed on the base are substantially equal, the planar shapes of a plurality of concave portions or the convex portions are the overlapped circles and the overlapped polygons, or any one of the aforesaid circles and polygons, and a plurality of concave portions or the convex portions are randomly arranged over a plane.

(1) Mobile Computer

Figure 16:
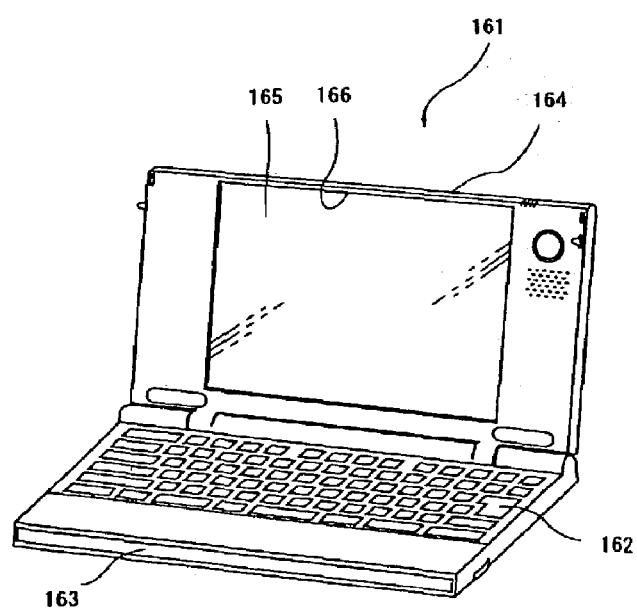
FIG. 16 is a perspective view of a personal computer serving as one example of electronic apparatus.

Now, a mobile personal computer, i.e., a personal notebook computer, provided with a display unit employing the liquid crystal display device of the present invention is described. FIG. 16 is a perspective view of such personal computer. As shown in FIG. 16, the personal computer 161 comprises a main body 163 provided with a key board 162, and the display unit 164 employing the liquid crystal display device of the present invention. In the display unit 164, the liquid crystal display device 160 of the present invention is accommodated by a case 166 having the plastic protective plate 145 corresponding to a window unit 165. More specifically, the liquid crystal display device 160 is accommodated by the case 166 so that the substrate surface at the viewing side is located close to the protective plate 145. In the personal computer 161, in order to obtain the excellent visibility under the condition of sufficient external light, there is required the semi-transmitting/reflecting-type liquid crystal display device provided with the back light unit 153 on the rear side, as described in the sixth embodiment.

(2) Mobile Telephone

Figure 17:
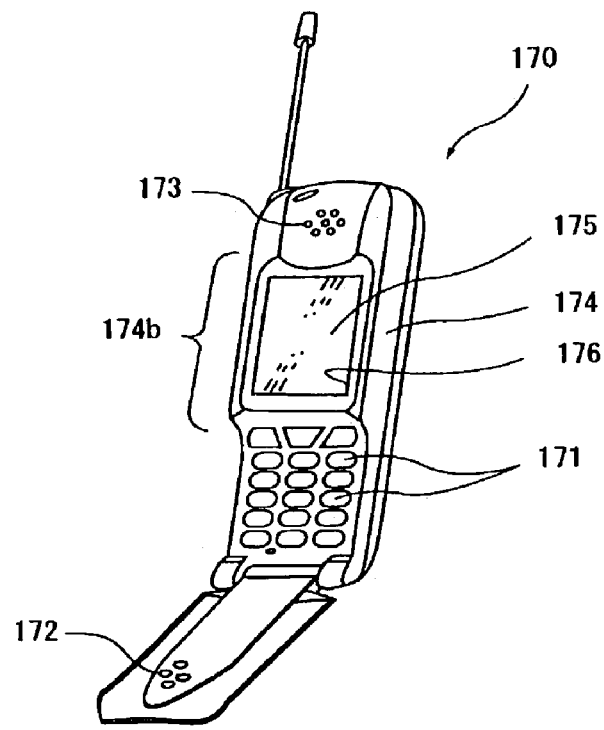
FIG. 17 is a perspective view of a mobile phone serving as an example of electronic apparatus.
Figure 18:
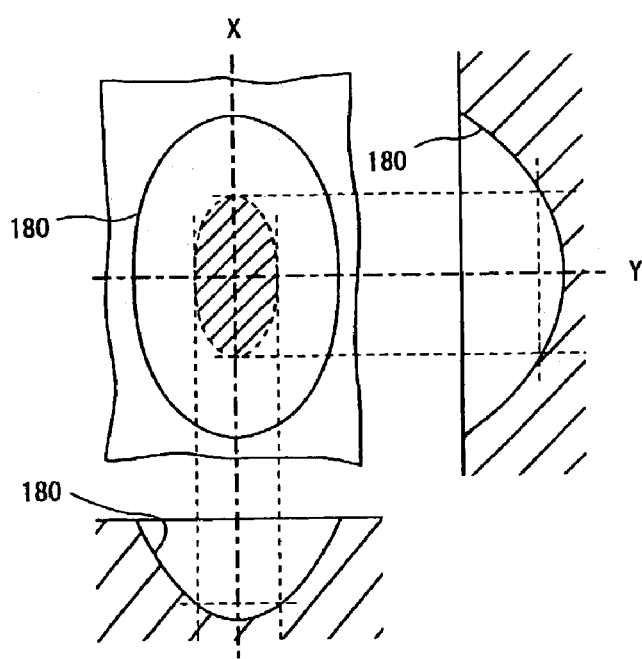
FIG. 18 shows plan and cross-sectional views of a substrate with a light reflecting film including a substantially cone-shaped depressed portion.
Figure 19:
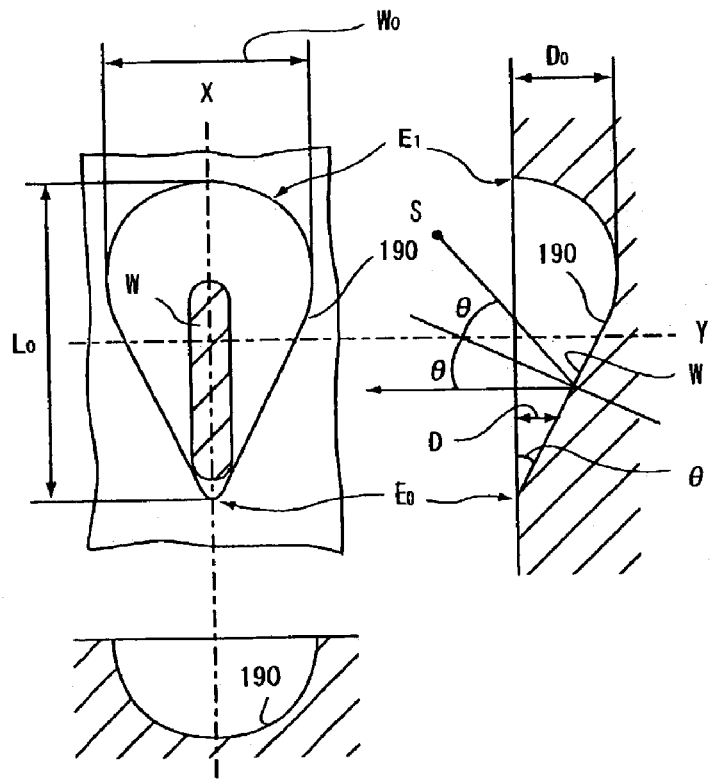
FIG. 19 shows plan and cross-sectional views of a substrate with a light reflecting film including a substantially non-symmetrical teardrop-shaped depressed portion.
Figure 20:
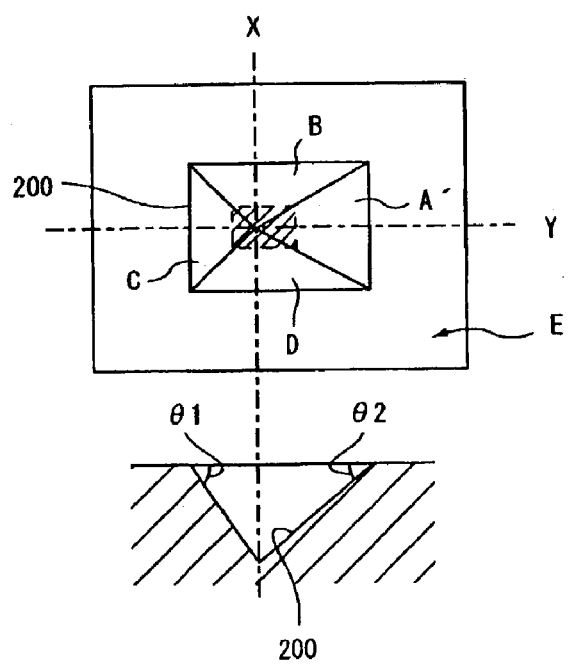
FIG. 20 shows plan and cross-sectional views of a substrate with a light reflecting film including a substantially non-symmetrical pyramid-shaped depressed portion.
Figure 21:
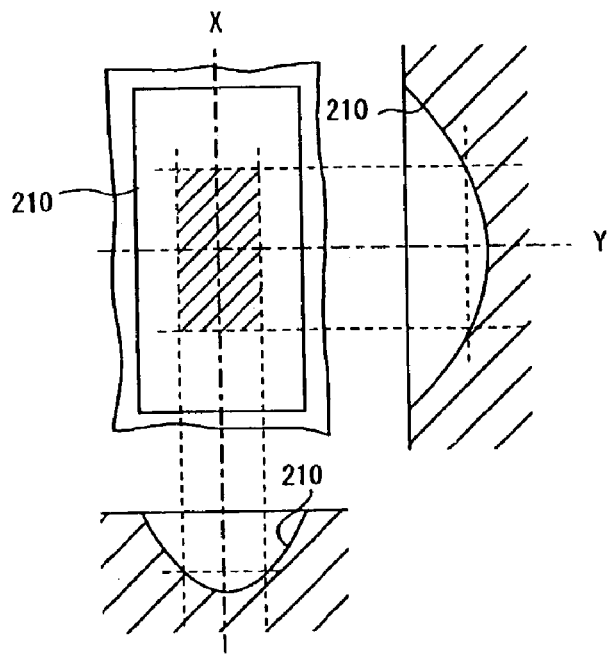
FIG. 21 shows plan and cross-sectional views of a substrate with a light reflecting film including a depressed portion in which its cross-section has an arc shape with a small radius of curvature, and its longitudinal-section has an arc shape with a large radius of curvature.
Figure 22:
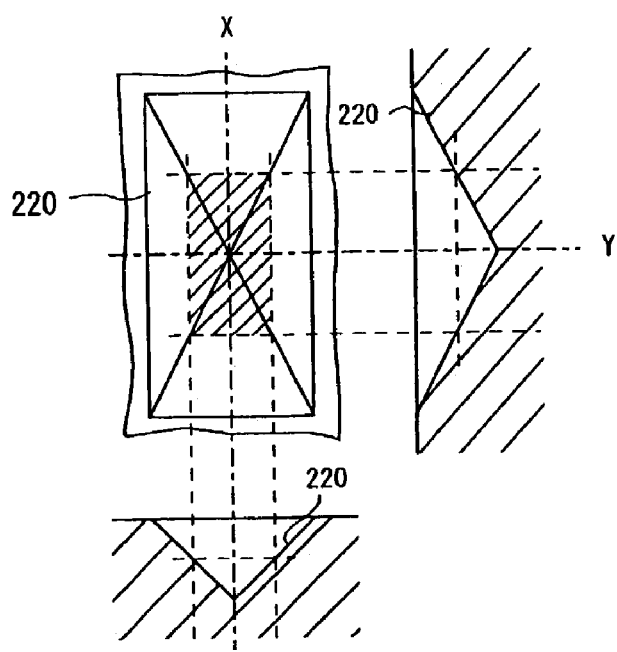
FIG. 22 shows plan and cross-sectional views of a substrate with a light reflecting film including a depressed portion in which its cross-section is substantially rectangular, and its longitudinal-section is pyramid.

Now, a mobile telephone having a display unit employing the liquid crystal display device of the present invention is described. FIG. 17 is a perspective view of such mobile telephone. As shown in FIG. 17, the mobile telephone 170 comprises a plurality of operation buttons 171, a mouse piece 172, a ear peace 173, and the display unit 174 employing the liquid crystal display device (not shown) of the present invention. In the mobile telephone 170, the liquid crystal display device of the present invention is accommodated by a case 176 having a plastic protective plate 175 corresponding to a window unit 174b. In the mobile phone 170, like the above personal computer, the liquid crystal display device is accommodated by the case 176 so that the substrate surface at the display side is located close to the protective plate 175.

In other than the personal computer of FIG. 16 and the mobile telephone of FIG. 17, the liquid crystal display device of the present invention is employed in various electronic apparatus such as liquid crystal TVs, view finder-type or monitor direct view type video tape recorders, car navigation apparatuses, pagers, electronic notebook, electronic calculator, word processors, work stations, TV phones, POS terminals, touch panels, etc.

As apparent from the above description, the present invention provides a liquid crystal display device in which even if a protective plate with the finely uneven surface is located near the substrate surface of the liquid crystal display unit, it is possible to prevent the degrading of display quality due to the unevenness. Accordingly, by locating the protective plate near the liquid crystal display device, it is possible to slimming or miniaturize electronic apparatus without degrading the display quality.

Other Constitutions

Any deterioration of the display quality due to the convex and concave constitutions of the surface of the substrate in a liquid crystal display device comprising a substrate with a light reflecting film of the present invention or an electronic apparatus comprising a substrate with a light reflecting film of the present invention, is efficiently prevented even in case that the a protective plate having fine concave and convex constitutions formed on the surface thereof is closely disposed on a unit or an apparatus.

Although the aforesaid effect is obtained by constitution of the liquid crystal display device or the electronic apparatus as described above in detail, the following constitutions will provide the same effect.

(1) A liquid crystal display device comprising: a liquid crystal interposed between a pair of substrates which oppose each other, and a protective plate side disposed on the surface of one of the substrates, i.e., the substrate on the viewing side, wherein the device further comprises a scattering layer disposed on the protective plate with respect to the liquid crystal for scattering the transmitted light therethrough, and a reflecting layer disposed on the side opposite to the viewing side with respect to the liquid crystal and having a plurality of convex and concave constitutions formed on the surface thereof.

(2) The liquid crystal display device according to (1), wherein haze value of the scattering layer is any value within the range of 10 to 60%.

(3) The liquid crystal display device according to (1) or (2), wherein the reflecting layer further has openings for transmitting light therethrough.

(4) A liquid crystal display device comprising: a pair of substrates with a liquid crystal interposed between the substrates, and a protective plate disposed closely to the surface of one of the substrates, i.e. the substrate on the viewing side, wherein the unit further comprises a scattering layer disposed on the protective plate side with respect to the liquid crystal for scattering the transmitted light therethrough, and wherein haze value of the scattering layer is any value within the range of 10 to 60%.

(5) The liquid crystal display device according to any one of (1) to (4) above, wherein the scattering layer is disposed between the substrate on the viewing side and a polarizing plate disposed on the substrate on the viewing side.

(6) The liquid crystal display device according to any one of (1) to (5) above, wherein the scattering layer scatters a plurality of fine particles scattered in an adhesive agent.

(7) An electronic apparatus comprising a liquid crystal display device according to any one of (1) to (6), and a protective plate disposed closely to the substrate on the viewing side of the liquid crystal display device.

Effects of the Invention

As apparent from the above description, a mask and a substrate with a light reflecting film obtainable by the mask according to the present invention each comprise light-transmitting parts or the non-light-transmitting parts, or a plurality of concave portions or convex portions, all of which have specific random patterns, whereby design and manufacture thereof is easy. Also, a reflecting layer having a small flat area and a smooth inclined surface is formed on a base having a plurality of concave portions or the convex portions, and the generation of interference fringes is effectively prevented in case that the reflecting layer is used in a liquid crystal display device.

Further, patterns having a small amount of information can be used repeatedly in a mask according to the present invention, whereby a mask suitable for obtaining a substrate with a light reflecting film which reduces the occurrence of interference fringes can be designed easily and quickly in a large-sized liquid crystal display device as well as a small-sized liquid crystal display device.

Furthermore, the generation of the interference fringes in an electro-optical device and an electronic apparatus comprising a substrate with a light reflecting film according to the present invention is reduced, and thus the device or the apparatus can be easily designed and manufactured. Furthermore, the generation of irregular stains in an electro-optical device and an electronic apparatus comprising a substrate with a light reflecting film according to the present invention is effectively suppressed in combination with light scattering films even in case that a plurality of concave portions or convex parts of the substrate with the light reflecting film are formed in random patterns.

Moreover, any deterioration of the display quality due to the convex and concave constitutions of the surface is sufficiently prevented in an electro-optical device comprising a substrate with light reflecting film according to the present invention and an electronic apparatus comprising a substrate with a light reflecting film according to the present invention, even in case the a protective plate having fine concave and convex constitutions formed on the surface thereof is closely disposed to the apparatus or the apparatus.

Furthermore, a substrate with a light reflecting film, an electro-optical device, and an electronic apparatus can be properly applied to a display device using electrophoresis in addition to the liquid crystal liquid unit, as described as preferred embodiments of the present invention.

The entire disclosure of Japanese Patent Application No. 2002-108527 filed Apr. 10, 2002 is incorporated by reference.

What is claimed is:

1. A substrate comprising:
 a light reflecting film formed on the substrate having a plurality of dot regions;
 the light reflecting film having concave portions or convex portions; and
 wherein the concave portions or the convex portions are formed in predetermined shapes, the predetermined shapes partially overlapping each other.

2. The substrate with a light reflecting film according to claim 1, wherein the depths of the concave portions or the heights of the convex portions are substantially equal in a plane.

3. The substrate with a light reflecting film according to claim 1, wherein the diameters of the concave portions or the convex portions are any values within the range of 3 to 15 $\mu$m.

4. The substrate with a light reflecting film according to claim 1, wherein pitches between the concave portions or pitches between the convex portions are any values within the range of 2 to 30 $\mu$m.

5. The substrate with a light reflecting film according to claim 1, wherein the depths of the concave portions or the heights of the convex portions are any values within the range of 0.1 to 10 $\mu$m.

6. The substrate with a light reflecting film according to claim 1, wherein the substrate has a plurality of units and the number of the units defined by a plurality of the dots is less than the number of dot regions.

7. The substrate with a light reflecting film according to claim 1, wherein the substrate has a plurality of convex portions or a plurality of concave portions, each of the plurality of concave portions has different diameters, or each of the plurality of convex portions has different diameters.

8. The substrate with a light reflecting film according to claim 1 wherein patterns formed by the concave portions or the convex portions are formed in one unit of a plurality of dots, the patterns including symmetric portions in the unit.

9. An electro-optical device having a plurality of dot regions, comprising:
 a substrate having a light reflecting film formed thereon, the light reflecting film having concave portions or convex portions; and
 an electro-optical layer supported by the substrate,
 wherein the concave portions or the convex portions are formed in predetermined shapes, the predetermined shapes partially overlapping each other.

10. The electro-optical device according to claim 9, wherein the depths of the concave portions or the heights of the convex portions are substantially equal in a plane.

11. The electro-optical device according to claim 9, wherein the electro-optical device has a plurality of units, and the number of the units defined by a plurality of the dots is less than the number of dot regions.

12. The electro-optical device according to claim 9, wherein one pixel is formed by a plurality of colored layers having different colors which are disposed corresponding to a plurality of the dots, and a plurality of the dots corresponding to the colored layers, whereby at least one pixel corresponds to one unit.

13. The electro-optical device according to claim 9 wherein patterns formed by the concave portions or by the convex portions are formed in one unit of a plurality of dots, the patterns including symmetrical portions in the unit.

14. An electronic apparatus comprising an electro-optical device as a display unit, wherein the electro-optical device is an electro-optical device according to claim 13.

15. The electro-optical device according to claim 13, wherein one pixel is formed by a plurality of colored layers having different colors which are disposed corresponding to a plurality of the dots and a plurality of the dots corresponding to the colored layers, whereby at least one pixel corresponds to one unit.

16. An electronic apparatus comprising an electro-optical device as a display unit, wherein the electro-optical device is an electro-optical device according to claim 9.

17. An electro-optical device comprising:
an electro-optical layer;
a light scattering film disposed on one side of the electro-optical layer; and
a light reflecting film disposed on the other side of the electro-optical layer,
wherein concave portions or convex portions are formed on the light reflecting film, the concave portions or the convex portions being non-uniformly arranged, and
wherein the concave portions or the convex portions are formed in predetermined shapes, the predetermined shapes partially overlapping each other.

18. The electro-optical device according to claim 17, wherein the haze value of the light scattering film is any value within the range of 10 to 60%.

19. The electro-optical device according to claim 17, wherein:
the device has a plurality of dot regions;
patterns formed by the concave portions or the convex portions are non-uniformly arranged in one unit defined by one dot or two dots; and
the haze value of the light scattering film is any value within the range of 40 to 60%.

20. The electro-optical device according to claim 19, wherein one pixel is formed by a plurality of the dots and a plurality of colored layers having different colors which are disposed corresponding to the plurality of dots, whereby at least one pixel corresponds to one unit.

21. The electro-optical device according to claim 17, wherein:
the device has a plurality of dot regions;
patterns formed by the concave portions or the convex portions are non-uniformly arranged in one unit of three or more dots; and
the haze value of the light scattering film is any value within the range of 10 to 40%.

22. The electro-optical device according to claim 17, further comprising a protective plate disposed on the one side of the electro-optical device.

23. An electronic apparatus comprising the electro-optical device as a display unit, wherein the electro-optical device is an electro-optical device according to claim 17.

* * * * *